(12) United States Patent
Khanolkar et al.

(10) Patent No.: US 11,967,566 B2
(45) Date of Patent: Apr. 23, 2024

(54) ISOLATED TRANSFORMER WITH INTEGRATED SHIELD TOPOLOGY FOR REDUCED EMI

(71) Applicant: Texas Instruments Incorporated, Dallas, TX (US)

(72) Inventors: Vijaylaxmi Gumaste Khanolkar, Pune (IN); Robert Martinez, Lucas, TX (US); Zhemin Zhang, Allen, TX (US); Yongbin Chu, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/086,610

(22) Filed: Dec. 21, 2022

(65) Prior Publication Data

US 2023/0207483 A1 Jun. 29, 2023

Related U.S. Application Data

(62) Division of application No. 16/800,043, filed on Feb. 25, 2020, now Pat. No. 11,538,766.
(Continued)

(51) Int. Cl.
*H01L 23/552* (2006.01)
*H01F 27/28* (2006.01)
(Continued)

(52) U.S. Cl.
CPC ....... *H01L 23/552* (2013.01); *H01F 27/2804* (2013.01); *H01L 21/56* (2013.01);
(Continued)

(58) Field of Classification Search
None
See application file for complete search history.

(56) References Cited

U.S. PATENT DOCUMENTS

| 5,312,674 A | 5/1994 | Haertling et al. |
| 2003/0020583 A1 | 1/2003 | Hui et al. |

(Continued)

FOREIGN PATENT DOCUMENTS

JP 2005347287 12/2005

OTHER PUBLICATIONS

Park et al., "Ferrite-Based Integrated Planar Inductors and Transformers Fabricated at Low Temperatures", IEEE Transactions on Magnetics, vol. 33, No. 5, Sep. 1997, 3 pages.
(Continued)

*Primary Examiner* — Long Pham
(74) *Attorney, Agent, or Firm* — Ronald O. Neerings; Frank D. Cimino

(57) ABSTRACT

A packaged electronic device includes first conductive leads and second conductive leads at least partially exposed to an exterior of a package structure, and a multilevel lamination structure in the package structure. The multilevel lamination structure includes a first patterned conductive feature having multiple turns in a first level to form a first winding coupled to at least one of the first conductive leads in a first circuit, a second patterned conductive feature having multiple turns in a different level to form a second winding coupled to at least one of the second conductive leads in a second circuit isolated from the first circuit, and a conductive shield trace having multiple turns in a second level spaced apart from and between the first patterned conductive feature and the second patterned conductive feature, the conductive shield trace coupled in the first circuit.

29 Claims, 18 Drawing Sheets

Related U.S. Application Data

(60) Provisional application No. 62/810,812, filed on Feb. 26, 2019.

(51) Int. Cl.
    *H01L 21/56*       (2006.01)
    *H01L 23/495*     (2006.01)
    *H01L 25/00*       (2006.01)

(52) U.S. Cl.
    CPC ........ *H01L 23/49575* (2013.01); *H01L 25/50* (2013.01); *H01F 2027/2809* (2013.01)

(56) References Cited

U.S. PATENT DOCUMENTS

| | | |
|---|---|---|
| 2005/0128038 A1 | 6/2005 | Hyvonen |
| 2009/0065594 A1 | 3/2009 | Kato et al. |
| 2009/0243782 A1 | 10/2009 | Fouquet et al. |
| 2010/0148911 A1 | 6/2010 | Fouquet et al. |
| 2010/0259909 A1* | 10/2010 | Ho .................... H03H 7/46 361/767 |
| 2010/0265030 A1 | 10/2010 | Weekamp et al. |
| 2011/0057291 A1 | 3/2011 | Slupsky et al. |
| 2011/0095620 A1 | 4/2011 | Fouquet et al. |
| 2011/0234357 A1 | 9/2011 | Kim et al. |
| 2012/0020419 A1 | 1/2012 | Kaeriyama |
| 2012/0168901 A1 | 7/2012 | Santangelo et al. |
| 2013/0043970 A1 | 2/2013 | Poddar et al. |
| 2013/0082812 A1 | 4/2013 | Yoo et al. |
| 2014/0176287 A1 | 6/2014 | Kato |
| 2014/0252533 A1 | 9/2014 | O'Sullivan |
| 2015/0069572 A1 | 3/2015 | Khanolkar et al. |
| 2015/0108603 A1 | 4/2015 | Yen et al. |
| 2015/0115402 A1 | 4/2015 | Yen et al. |
| 2015/0155090 A1* | 6/2015 | Burnett ............ H01F 27/2804 336/200 |
| 2016/0069662 A1 | 3/2016 | Mullenix et al. |
| 2017/0059364 A1 | 3/2017 | Mullenix |
| 2017/0178787 A1 | 6/2017 | Massolini et al. |
| 2017/0194088 A1* | 7/2017 | Massolini ........... H01F 27/2804 |
| 2018/0190573 A1 | 7/2018 | Mullenix et al. |
| 2020/0402709 A1* | 12/2020 | Zhai .................... H01F 27/2804 |

OTHER PUBLICATIONS

Brandon et al., "Printed Microinductors on Flexible Substrates for Power Applications", IEEE Transactions on Components and Packaging Technologies, vol. 26, No. 3, Sep. 2003, 7 pages.

Ouyang, Z. and M. Andersen "Overview of Planar Magnetic Technology—Fundamental Properties." vol. 29, No. 9, Sep. 2014, IEEE Transactions on Power Electronics: 4888-4900.

Chen, Baoxing et al., "High Speed Digital Isolators Using Microscale On-Chip Transformers", 72203-12709274, Non_Patent_Literature, May 18, 2010 (Year: 2010).

Bang, D.H., and J.Y. Park. "Ni—Zn Ferrite Screen Printed Power Inductors for Compact DC-DC Power Converter Applications." vol. 45, No. 6, Jun. 2009, IEEE Transactions on Magnetics: 2762-65.

Hurley, W.G., M.C. Duffy, S. O'Reilly, and S.C. O'Mathuna. "Impedance Formulas for Planar Magnetic Structures with Spiral Windings." vol. 46, No. 2, Apr. 2009, IEEE Transactions on Industrial Electronics: 271-78.

Lu, Junwei, and F. Dawson. "Characterizations of High Frequency Planar Transformer With a Novel Comb-Shaped Shield." vol. 47, No. 10, Oct. 2011, IEEE Transactions on Magnetics: 4493-496.

Liu, X., and S.Y.R. Hui. "An Analysis of a Double-layer Electromagnetic Shield for a Universal Contactless Battery Charging Platform." IEEE 36th Conference on Power Electronics Specialists, 2005, pp. 1767-1772.

Roshen, W.A. "Analysis of Planar Sandwich Inductors by Current Images." vol. 26, No. 5, Sep. 1990, IEEE Transactions on Magnetics: 2880-87.

Tang, S.C., S.Y. Ron Hui and H. Shu-Hung Chung. "Evaluation of the Shielding Effects on Printed-Circuit-Board Transformers Using Ferrite Plates and Copper Sheets." vol. 17, No. 6, Nov. 2002, IEEE Transactions on Power Electronics: 1080-88.

Tang, S.C., S.Y. Ron Hui, and Henry Shu-Hung Chung. "A Low Profile Power Converter Using Printed-Circuit Board (PCB Power Transformer with Ferrite Polymer Composite." vol. 16, No. 4, Jul. 2001, IEEE Transactions on Power Electronics: 493-498.

\* cited by examiner

ISOLATED TRANSFORMER WITH INTEGRATED SHIELD TOPOLOGY FOR REDUCED EMI

CROSS-REFERENCE TO RELATED APPLICATIONS

This application is a divisional of co-pending application Ser. No. 16/800,043 filed Jul. 29, 2020, which claims priority to, and the benefit of, U.S. provisional patent application No. 62/810,812, entitled "Isolated Transformer with Integrated Shield Topology for Reduced EMI", filed on Feb. 26, 2019, the entirety of both of which is hereby incorporated by reference.

BACKGROUND

Integrated isolated power products are packaged electronic devices having semiconductor dies and integrated transformers with electrical connections to externally accessible leads (e.g., pins or pads) for soldering to a printed circuit board (PCB). Isolated DC to DC converters can be built using integrated high voltage isolation transformers, there the transformer coils can be fabricated in a lamination structure for integration in a packaged electronic device. Many DC to DC converters have design specifications for electromagnetic interference (EMI), such as CISPR32 and CISPR25 EMI emission requirements for multimedia equipment (MME) with a rated rms AC or DC supply voltage not exceeding 600 V set by the Comité International Special des Perturbations Radioelectriques (CISPR). Switching of primary and/or secondary side transistors in a DC to DC converter can cause conducted and/or emitted EMI, for example, there the transformer of an isolated DC to DC converter can be a path of electromagnetic energy due to its inter-winding capacitance. EMI can be controlled using ferrite beads, additional capacitors, or other external (e.g., board level) components, but this increases circuit area, weight and cost. In addition, each design has different specifications with respect to electric fields, efficiency and electromagnetic interference (EMI) performance. Other EMI control approaches include spread spectrum modulation (SSM) for controlling the DC to DC converter switching, but this requires additional die space and often only provides incremental EMI improvement.

SUMMARY

In accordance with one aspect, a packaged electronic device includes conductive leads at least partially exposed to an exterior of a package structure, second conductive leads at least partially exposed to the exterior of the package structure, and a multilevel lamination structure in the package structure. The multilevel lamination structure includes first and second patterned conductive feature, and a conductive shield trace. The first patterned conductive feature has multiple turns in a first level of the multilevel lamination structure to form a first winding coupled to at least one of the first conductive leads in a first circuit. The second patterned conductive feature has multiple turns in a different level to form a second winding coupled to at least one of the second conductive leads in a second circuit isolated from the first circuit. The conductive shield trace has multiple turns in a second level spaced apart from and between the first patterned conductive feature and the second patterned conductive feature. The conductive shield trace is coupled in the first circuit.

In one example, the multilevel lamination structure includes a second conductive shield trace having multiple turns in another level between the first patterned conductive feature and the second patterned conductive feature. The second conductive shield trace is coupled in the second circuit, and the second conductive shield trace is spaced apart from the first conductive shield trace. In one example, the first conductive shield trace is coupled to a ground reference node of the first circuit, and the second conductive shield trace is coupled to a second ground reference node of the second circuit. The shield or shields can be peripherally located with respect to the patterned conductive features in certain implementations. In one example, the first conductive shield trace includes a turn laterally spaced outward from an outermost lateral extent of the first patterned conductive feature in the first level, and the second conductive shield trace includes a turn laterally spaced outward from an outermost turn of the second patterned conductive feature in the different level. In certain implementations, the shield or shields can be interleaved with the patterned conductive features. In one example, the first conductive shield trace is interleaved with a turn of the first patterned conductive feature in the first level, and the second conductive shield trace is interleaved with a turn of the second patterned conductive feature in the different level.

In accordance with another aspect, a multilevel lamination structure includes a first patterned conductive feature having multiple turns in a first level to form a first winding, as well as a second patterned conductive feature having multiple turns in a different level to form a second winding, and a conductive shield trace having multiple turns in a second level spaced apart from and between the first patterned conductive feature and the second patterned conductive feature. In one example, the multilevel lamination structure further includes a second conductive shield trace having multiple turns in another level between the first patterned conductive feature and the second patterned conductive feature. In one example, the first conductive shield trace includes a turn laterally spaced outward from an outermost lateral extent of the first patterned conductive feature in the first level, and the second conductive shield trace includes a turn laterally spaced outward from an outermost turn of the second patterned conductive feature in the different level. In one example, the first conductive shield trace is interleaved with a turn of the first patterned conductive feature in the first level, and the second conductive shield trace is interleaved with a turn of the second patterned conductive feature in the different level.

In accordance with another aspect, a method includes attaching a magnetic assembly with a multilevel lamination structure to a support structure, attaching a first semiconductor die to a first die attach pad, and attaching a second semiconductor die to a second die attach pad, as well as performing an electrical connection process and a molding process. The electrical connection process couples the first semiconductor die, a first winding of the multilevel lamination structure, a first conductive shield trace of the multilevel lamination structure, and at least one of a set of first conductive leads in a first circuit. In addition, the electrical connection process couples the second semiconductor die, a second winding of the multilevel lamination structure, a second conductive shield trace of the multilevel lamination structure, and at least one a set of second conductive leads in a second circuit isolated from the first circuit. The molding process encloses the magnetic assembly, the die attach pads, the semiconductor dies, portions of the first and second conductive leads in a package structure. In one example, the electrical connection process couples the first conductive shield trace to a ground reference node of the first circuit, and couples the second conductive shield trace to a second ground reference node of the second circuit.

DETAILED DESCRIPTION

Figure 1:
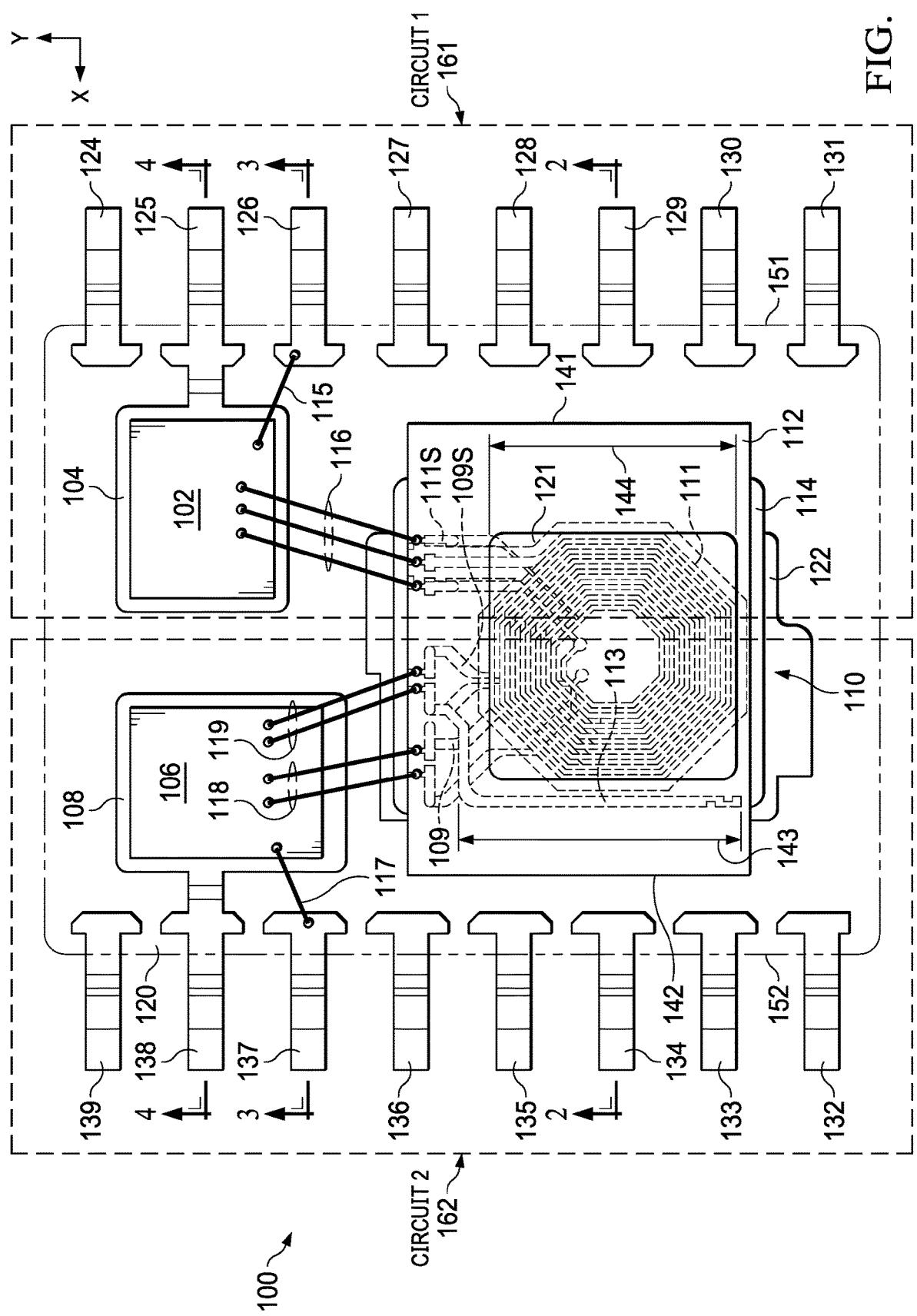
FIG. 1 is a bottom view of a packaged electronic device that includes a magnetic assembly having conductive shield traces.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . ." Also, the term "couple" or "couples" is intended to include indirect or direct electrical or mechanical connection or combinations thereof. For example, if a first device couples to or is coupled with a second device, that connection may be through a direct electrical connection, or through an indirect electrical connection via one or more intervening devices and connections.

Referring initially to FIGS. 1-6, described examples provide packaged electronic devices with integrated magnetics, such as DC to DC converters with integrated isolation transformers, having one or more conductive shield traces to mitigate or control EMI emissions. The EMI solutions of the illustrated examples provide advantages in terms of EMI reduction over SSM, and provide circuit area, weight and cost advantages over use of additional board level components such as ferrite beads and/or additional capacitors. The use of a transformer with integrated shield technology allows end users to reduce EMI without the need of discrete ferrite beads that add cost to the solution and without requiring EMI reduction expertise to design a system using the packaged electronic device. Asymmetrical voltages across an isolation barrier impedance of a DC to DC converter can create emissions through the two isolated ground planes becoming a dipole antenna and radiating noise. FIGS. 1-6 show an example packaged electronic device 100 with a laminated magnetic assembly having conductive shield traces between windings of different voltage domains, such as primary and secondary transformer windings.

Figure 2:
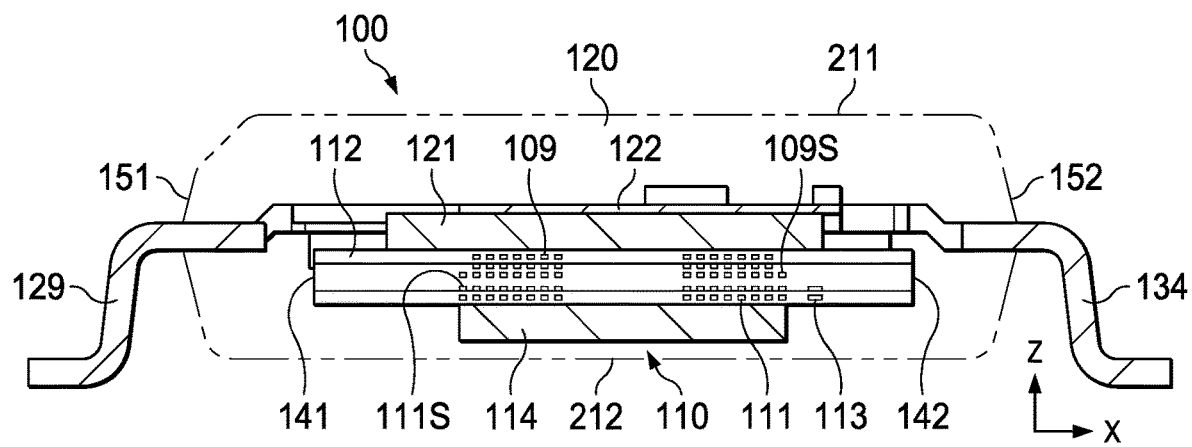
FIG. 2 is a partial sectional end view of the packaged electronic device taken along line 2-2 of FIG. 1.
Figure 3:
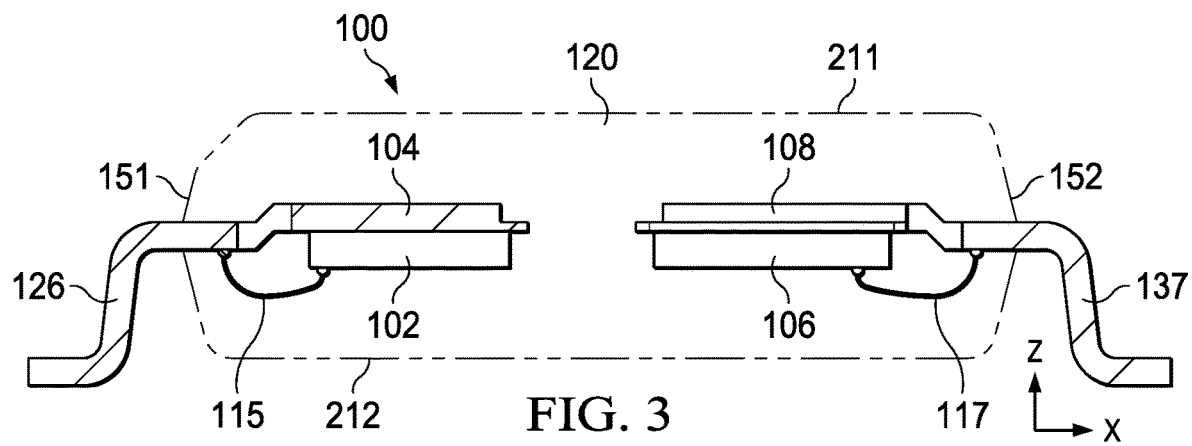
FIG. 3 is a partial sectional end elevation view of the packaged electronic device taken along line 3-3 of FIG. 1.
Figure 4:
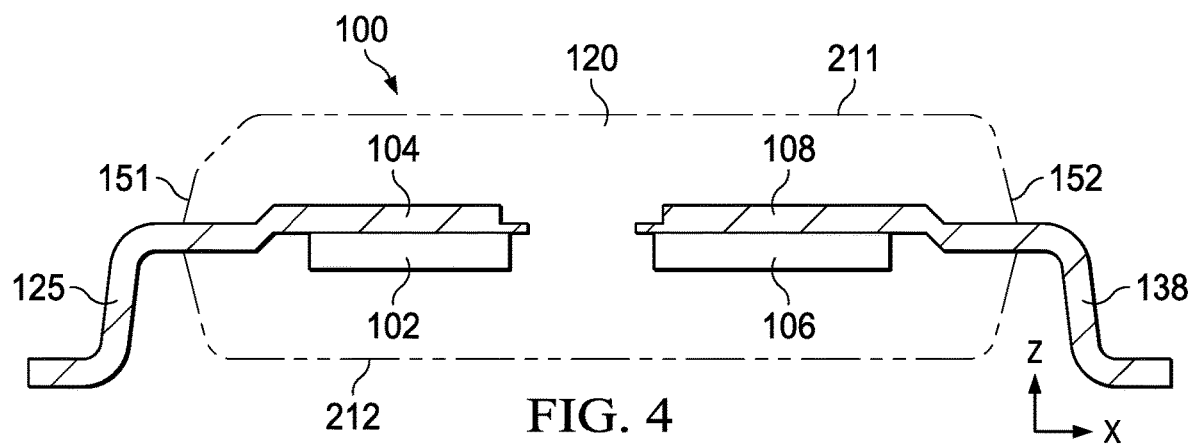
FIG. 4 is a partial sectional end view of the packaged electronic device taken along line 4-4 of FIG. 1.
Figure 5:
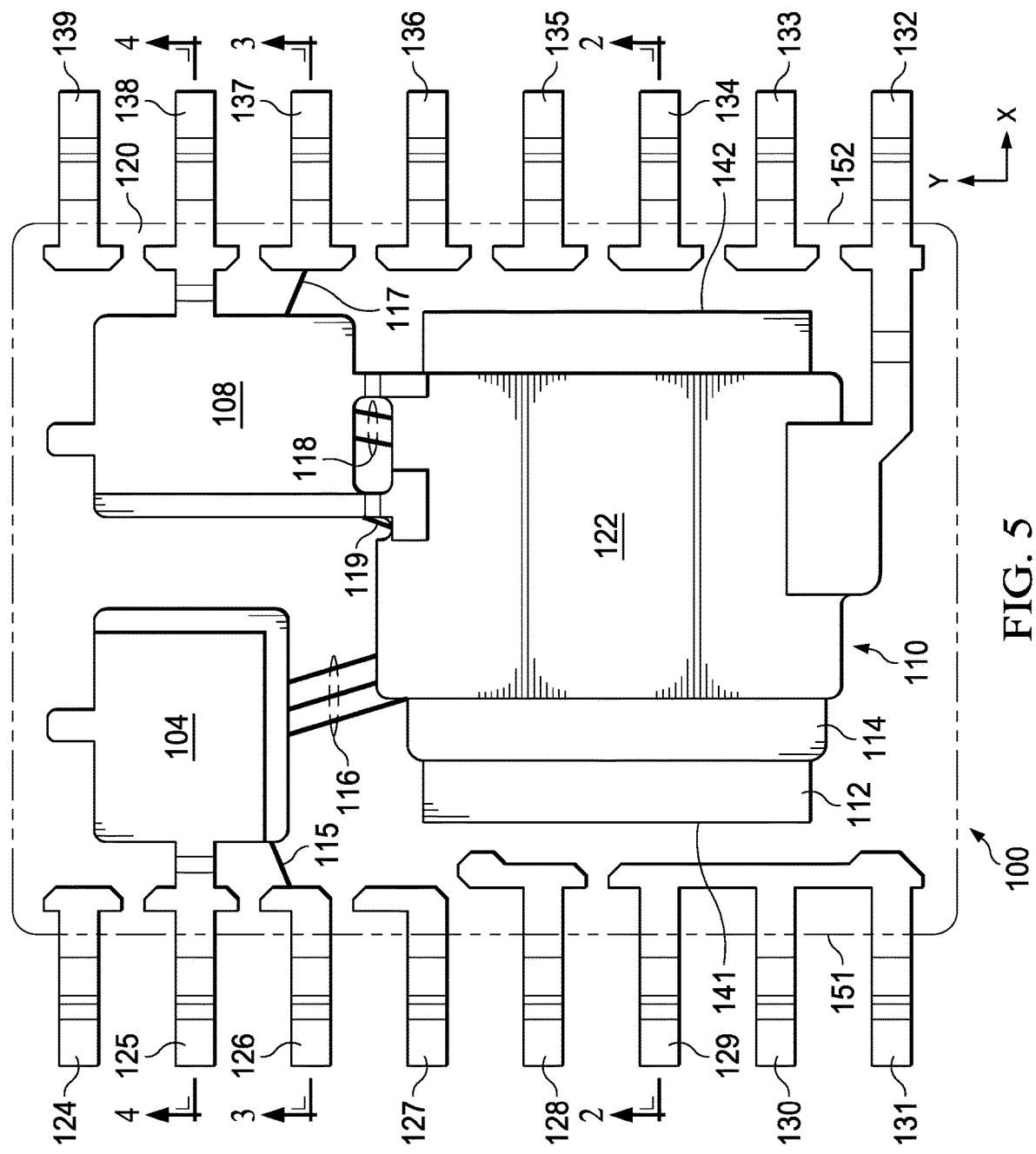
FIG. 5 is a top view of the packaged electronic device of FIGS. 1-4.
Figure 6:
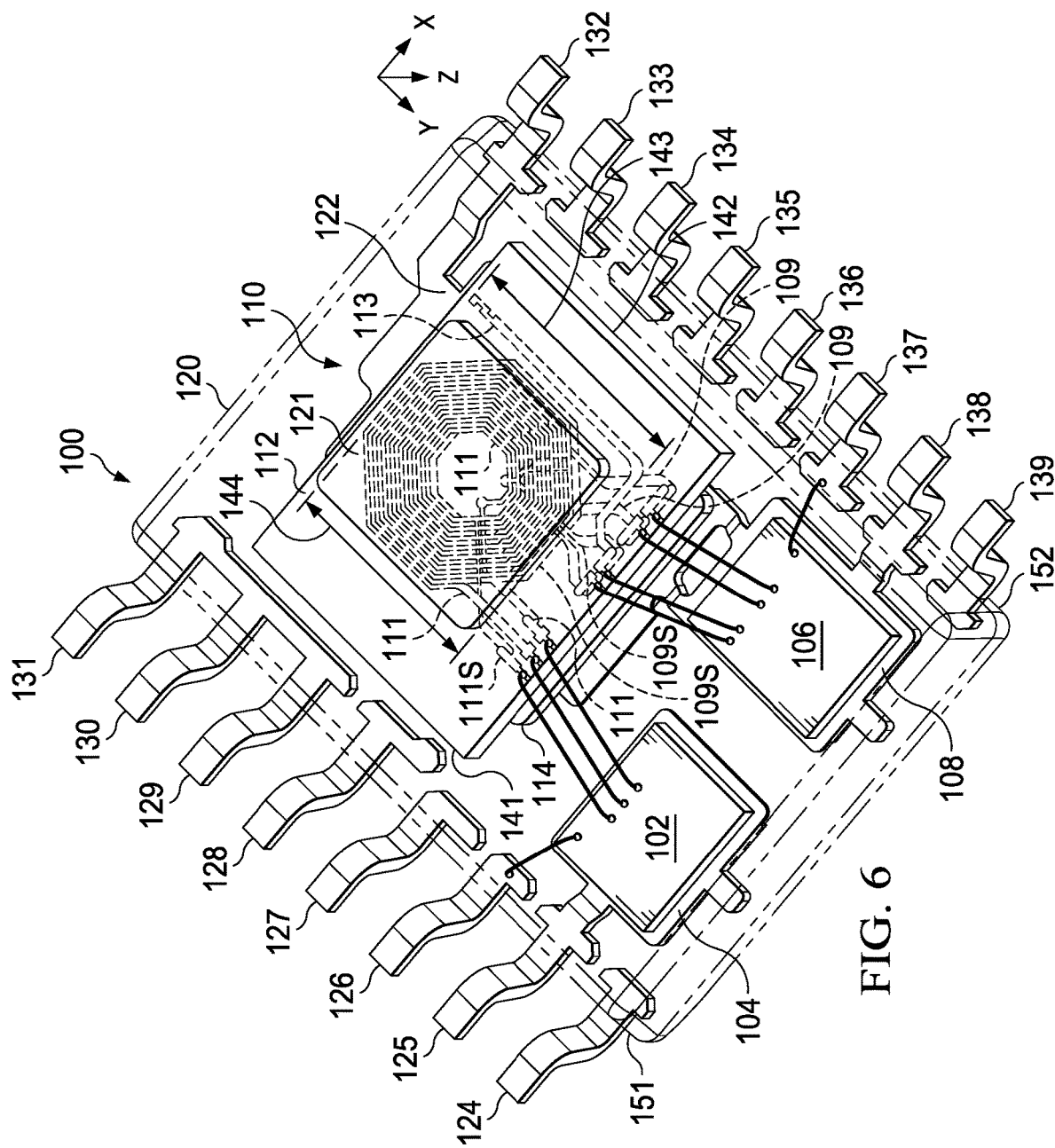
FIG. 6 is a bottom perspective view of the packaged electronic device of FIGS. 1-5.

The conductive shield trace solution can be used in products having symmetric or asymmetric magnetic assembly positioning and provides a scalable solution to accommodate designs with differing electric field, efficiency and/or EMI performance specifications. The conductive shield trace solution can be used with a magnetic assembly mounted with a semiconductor die to a shared die attach pad as shown in FIGS. 1-6, or the magnetic assembly can be separately supported on a conductive support structure spaced apart from integrated semiconductor dies and associated conductive die attach pads. Conductive shield traces can be provided in one or more layers or levels of the multilevel lamination structure. FIG. 1 shows a bottom view of the example device 100, and FIGS. 2-4 show partial sectional and elevation views along the respective lines 2-2, 3-3, and 4-4 in FIG. 1. FIG. 5 shows a top view, and FIG. 6 shows a bottom perspective view of the packaged electronic device 100.

The example electronic device 100 has a small outline integrated circuit (SOIC) package type with gull wing leads on opposite sides. Other packaged electronic devices can be provided in different implementations, including conductive features that can be soldered to another structure or structures for electrical interconnections, such as so called leadless package types (e.g., flat no-leads packages such as quad-flat no-leads (QFN), dual-flat no-leads (DFN), micro lead frame (MLF) and small-outline no leads (SON) types with planar conductive leads such as perimeter lands on the package bottom and/or side that provide electrical connections to a printed circuit board (PCB). In other examples, the device 100 includes a ball grid array (BGA) package or a land grid array (LGA) type, such as a mold array process ball grid array (MAPBGA) or an over-molded BGA (e.g. plastic BGA or PBGA).

In addition, the example device 100 of FIGS. 1-6 provides electrical interconnections for first and second electrical circuits, some or all of which are implemented using bond wires. In other implementations, different forms of interconnection types can be used, including substrate based interconnections (BGA, LGA, etc.), and which a substrate includes electrical interconnections and signal routing structures (e.g., copper or aluminum traces on one or more layers or levels) alone or in combination with bond wire electrical connections. As shown in FIG. 1, the example device 100 includes conductive features (e.g., conductive die attach pads or supports) for mounting and supporting first and second semiconductor dies and a laminated magnetic assembly. The die attach pads and device leads can include any suitable conductive structures, such as copper, aluminum, etc.

The example device 100 in FIG. 1 includes a first semiconductor die 102 attached to a first conductive die attach pad 104 of the lead frame assembly. The device 100 also includes a second semiconductor die 106 attached to a second conductive die attach pad 108. The electronic device 100 includes a first circuit (e.g., 161, labeled "CIRCUIT 1" in FIG. 1) associated with a first voltage domain (e.g., a high voltage primary circuit of an integrated power device). The device 100 also includes a second circuit (e.g., 162, labeled "CIRCUIT 2") associated with a second voltage domain (e.g., an isolated lower voltage secondary circuit). The second circuit 162 in this example includes a secondary winding formed by a second patterned conductive feature 109 (also referred to as a second winding) of a magnetic assembly 110. The laminated magnetic assembly 110 includes a first patterned conductive feature 111 (also referred to as a first winding) in a multilevel lamination structure 112. In the illustrated example, the multilevel lamination structure 112 includes multiple conductive features that form primary and secondary windings of a transformer. The first patterned conductive feature 111 has multiple turns in a first level (e.g., FIGS. 16-18 below) to form the first winding (e.g., a primary winding of an isolation transformer). The multilevel lamination structure 112 includes a second patterned conductive feature 109 having multiple turns in a different level to form a second winding (e.g., a transformer secondary winding). The multilevel lamination structure 112 also includes a conductive guard trace 113 spaced apart from the first patterned conductive feature 111 and positioned between an outermost turn of the first conductive feature 111 and a side of the device 100 associated with the second voltage domain. This helps keep high electric fields associated with the first and second domain voltage differences between the first (e.g., primary) winding and the leads of the second (e.g., secondary) circuit inside the lamination structure 112. In other implementations, the guard trace 113 can be omitted.

The example multilevel lamination structure 112 includes a first conductive shield trace 111S with multiple turns in a second level between the first patterned conductive feature 111 and the second patterned conductive feature 109. The conductive shield trace 111S is coupled in the first circuit 161. The example multilevel lamination structure 112 in FIGS. 1-6 also includes a second conductive shield trace 109S with multiple turns in another level between the first patterned conductive feature 111 and the second patterned conductive feature 109. In the example of FIGS. 1-6, the second conductive shield trace 109S is coupled to the conductive guard trace 113 in the second circuit 162. In another example, the second conductive shield trace 109S is omitted.

The magnetic assembly 110 also includes one or more core structures to facilitate forming a magnetic circuit in combination with the patterned conductive feature 111. The illustrated example includes a first (lower or bottom) core structure 114 as seen in FIGS. 1, 2, 5 and 6. The first core structure 114 is attached to a first side of the lamination structure 112. The electronic device 100 includes electrical connections such as bond wires 115, 116, 117, 118, and 119 that form electrical interconnections between certain components and leads. The packaged electronic device 100 also includes a package structure 120 that encloses the conductive die attach pads 104 and 108, the semiconductor dies 102 and 106, the magnetic assembly 110, and all or portions of conductive leads of the device 100. In one example, the package structure 120 is or includes a molded material, such as plastic. In another example, the package structure 120 is or includes a ceramic material.

The magnetic assembly 110 also includes a second (upper or top) core structure 121 (seen in FIGS. 1, 2, 5 and 6). The first core structure 114 is attached to a first side of the lamination structure 112, and the second core structure 121 is attached to a second side of the lamination structure 112. In one example, the first magnetic core structure 114 is the same size as the second core structure 121. In another example, the first magnetic core structure 114 is larger than the second core structure 121. In another example, the first magnetic core structure 114 is smaller than the second core structure 121. In one example, one or both magnetic core structures 114 and 121 are prefabricated magnetic cores attached using epoxy paste. In another example, one or both magnetic core structures 114 and 121 are fabricated using a thick layer of magnetic paste. The laminated magnetic assembly 110 is attached to a support structure 122 that is integral to the second conductive die attach pad 108. In another implementation, the magnetic assembly 110 is mounted to a support structure (not shown) that is separated and spaced apart from the first and second die attach pads 104 and 108.

A first set of the electrical connections includes a first set of bond wires 115 and 116 that couple the first conductive shield trace 111S (if included), the first semiconductor die 102, the first patterned conductive feature 111, and at least one of a set of first conductive leads 124-131 in the first (e.g., high voltage primary) circuit 161 of the device 100. As best shown in FIG. 1, the first conductive die attach pad 104 is directly coupled to a single first lead 125. In other examples, the first die attach pad 104 is directly coupled to multiple conductive first leads. In the example device 100, the die attach pad 104 and the lead 125 are a single continuous metal structure, such as copper or aluminum. A first bond wire 115 couples a conductive feature (e.g., bond pad) of the first semiconductor die 102 to the first lead 126, and bond wires 116 couple further bond pads of the first semiconductor die 102 to first and second ends of the first patterned conductive feature 111, and also couple a ground reference node of the first semiconductor die 102 to the first conductive shield trace 111S.

A second set of electrical connections in this example includes a second set of bond wires 117, 118 and 119 that couple the second conductive shield trace 109S (if included), the second semiconductor die 106, the second patterned conductive feature 109, the conductive guard trace 113 (if included), and at least one of a set of second conductive leads 132-139 in the second circuit 162 (e.g., a lower voltage secondary circuit) that is isolated from the first circuit 161. The second conductive die attach pad 108 is directly coupled to a single lead 138, and the connected support structure 122 is directly connected to a single lead 132. In other examples, the second die attach pad 108 and/or the support structure 122 is/are directly coupled to multiple conductive leads. In the example device 100, the second die attach pad 108, the support structure 122, and the leads 132 and 138 are a single continuous metal structure, such as copper or aluminum. A bond wire 117 couples a bond pad of the second semiconductor die 106 to the second lead 137. Bond wires 118 couple further bond pads of the second semiconductor die 106 to first and second ends of the second patterned conductive feature. In addition, bond wires 119 couple the second semiconductor die 106 to the second conductive shield trace 109S and to the conductive guard trace 113.

As best shown in FIGS. 2-4 and 6, the package structure 120 encloses the die attach pads 104 and 108, and the associated support structure 122. In addition, the package structure 120 encloses inner portions of the conductive leads 124-139. The conductive leads 124-139 in one example are so-called gull wing leads that extend downward and outward from the package structure 120 as shown in FIGS. 2-4 and 6. Different types and shapes of conductive leads are used in other examples (e.g., J leads). FIGS. 2-4 show respective sectional views of the packaged electronic device 100 taken along lines 2-2, 3-3, and 4-4 of FIGS. 1 and 5. As best shown in FIGS. 2-4, the example package structure 120 includes a top side 211 and an opposite bottom side 212.

The multilevel lamination structure 112 has a first side 141 facing the first conductive leads 124-131, and a second side 142 facing the second conductive leads 132-139. In this orientation, the conductive guard trace 113 is spaced apart from and between the first winding formed by the first patterned conductive feature 111 and the second conductive leads 132-139. The package structure 120 has respective first and second sides 151 and 152 spaced apart from one another along a first direction (e.g., the X direction in FIGS. 1-6). The first conductive leads 124-131 are located along, and extend outward from, the first side 151 of the package structure 120, and the second conductive leads 132-139 are located along, and extend outward from, the second side 152 of the package structure 120. The conductive guard trace 113 is spaced apart from and between the first patterned conductive feature 111 and the second side 152 of the package structure 120. As shown in FIGS. 1 and 6, the conductive guard trace 113 has a length 143 along a perpendicular second direction (e.g., the Y direction in FIGS. 1-6), and outermost turn of the first patterned conductive feature 111 has a shorter length 144 along the second direction.

In operation of the electronic device 100, the voltage of the first patterned conductive feature 111 can be much higher than the voltage of the second conductive leads 132-139 along the second side 152 of the package structure 120. Interior portions of the second conductive leads 132-139 are enclosed by the molding compound or ceramic material of the package structure 120, which has a lower dielectric constant than that of the lamination layers or levels of the multilevel lamination structure 112. Moreover, the external portions of the second conductive leads 132-139 are exposed to ambient air, which has a lower dielectric constant than those of the package structure 120 and the multilevel lamination structure 112. The longer length and positioning of the conductive guard trace 113 within the multilevel lamination structure 112 helps keep the high electric field in the high dielectric material of the multilevel lamination structure 112 to mitigate or avoid arcing during production testing and normal operation of the packaged electronic device 100.

Figure 7:
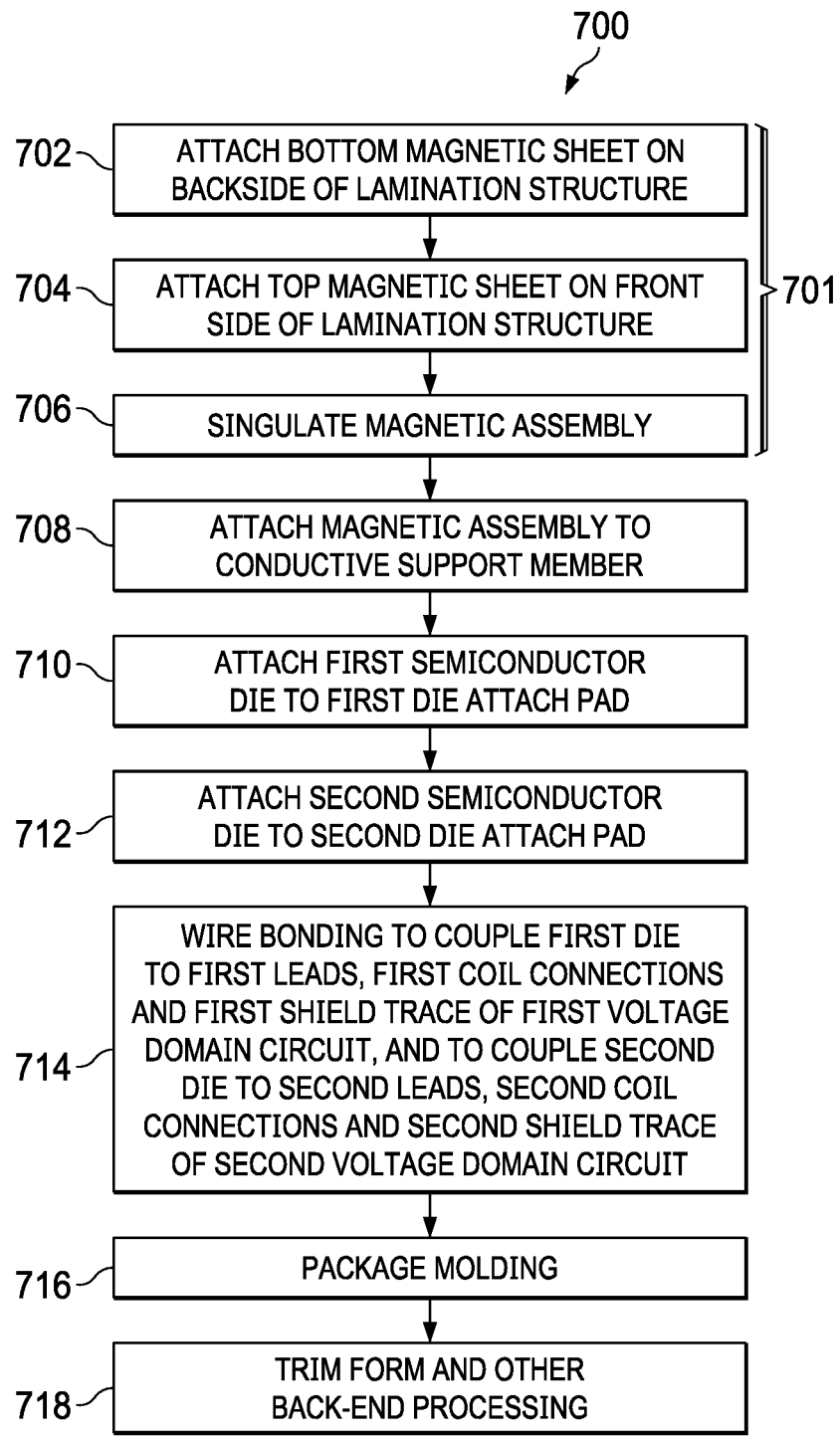
FIG. 7 is a flow diagram of a method of fabricating a packaged electronic device.
Figure 8:
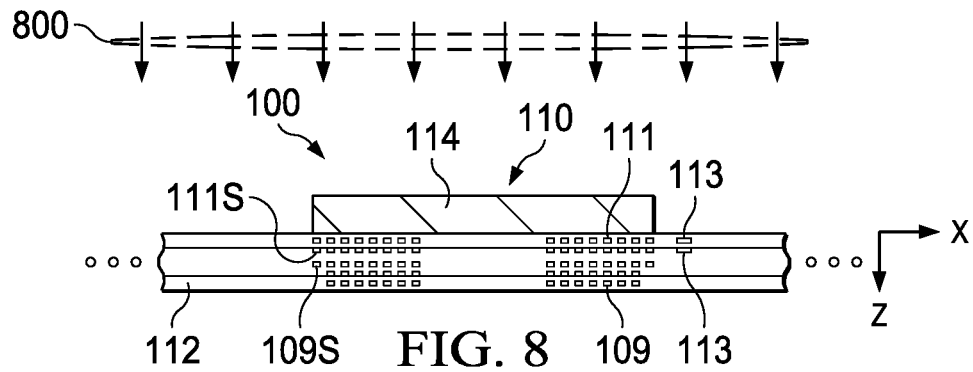
FIGS. 8-13 are partial sectional end elevation views of the packaged electronic device of FIGS. 1-6 undergoing fabrication according to the method of FIG. 7.

FIG. 7 shows a method 700 for fabricating a packaged electronic device, such as the device 100 of FIGS. 1-6, and FIGS. 8-13 show the example packaged electronic device 100 undergoing fabrication according to the method 700. The method 700 includes fabricating a laminated magnetic assembly with a conductive shield trace at 701. In certain implementations, the magnetic assembly is separately assembled and provided as an input to the method 700. In the illustrated example, the magnetic assembly fabrication at 701 includes attaching a bottom magnetic core (e.g., sheet) on a back side of a multilevel lamination structure at 702. FIG. 8 shows one example, in which an attachment process 800 is performed that attaches the first (lower or bottom) core structure 114 to a bottom side of the example multilevel lamination structure 112.

The multilevel lamination structure 112 can be any suitable multi-layer lamination with patterned conductive features 109 and 111, such as transformer windings, and a conductive guard trace 113. The patterned conductive features 109, 111 and 113 can be created by any suitable processing, such as screen-printing conductive material onto a laminate layer. The multilevel lamination structure 112 can include one or more bonding steps to bond laminate layers or sheets to one another to form the multilevel lamination structure 112. In one example, the lamination structure levels individually include a bismaleimide triazine (BT) laminate layer, and one, some or all the levels include patterned conductive features (e.g., copper or other electrically conductive material), such as traces forming windings or turns of windings. In some examples, the multilevel lamination structure 112 is built up layer by layer, for example, starting with a central or middle dielectric layer (e.g., a core dielectric layer), and each layer is added with any patterned copper conductive features and conductive vias to interconnect conductive features of different levels, to form a multilevel lamination structure 112. For high voltage isolation, the individual levels of the multilevel lamination structure 112 are or include high pressure BT laminate materials, which provide high voltage breakdown strength and can be pre-impregnated with a resin, such as epoxy resin. The individual BT laminate levels can be assembled using any suitable adhesive with any required curing, such as curing by a combination of heat and pressure.

The core structure 114 in one example is a magnetic sheet structure, although not required of all possible implementations. The attachment process 800 can include deposition of an epoxy or other adhesive onto the bottom surface of the multilevel lamination structure 112 and/or onto the surface of the core structure 114. The adhesive in one example is printed magnetic ink epoxy, although non-magnetic adhesives can be used in other examples. The attachment process 800 also includes bringing the core structure 114 into contact with the bottom side of the multilevel lamination structure 112 and/or into contact with the epoxy formed thereon. The attachment process 800 in one example also includes any necessary curing steps (e.g., thermal, optical, ultraviolet (UV), etc.).

Figure 9:
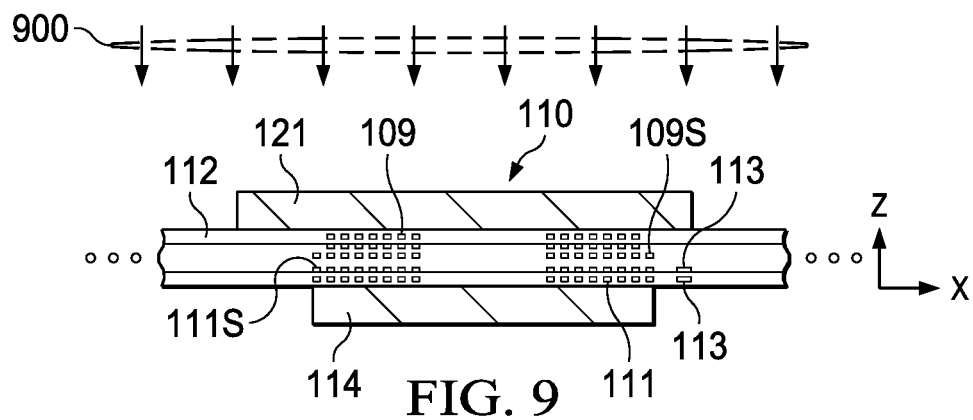

The method 700 continues at 704 with attaching a top magnetic core (e.g., sheet) on the front side of the lamination structure. FIG. 9 shows one example, in which a second attachment process 900 is performed that attaches the second (upper or top) core structure 121 to a second side of the lamination structure 112. The attachment process 900 can be the same or similar process as the first attachment process 800 used to attach the first core structure 114 to the lamination structure 112. The respective upper and lower core structures 121 and 114 are attached to the multilevel lamination structure 112 by epoxy or other suitable attachment structures and/or techniques to form a magnetically coupled transformer apparatus. In other examples, one of the upper or lower core structures 121 or 114 can be omitted, with the remaining core structure providing magnetic coupling for the transformer of the device 100.

Figure 10:
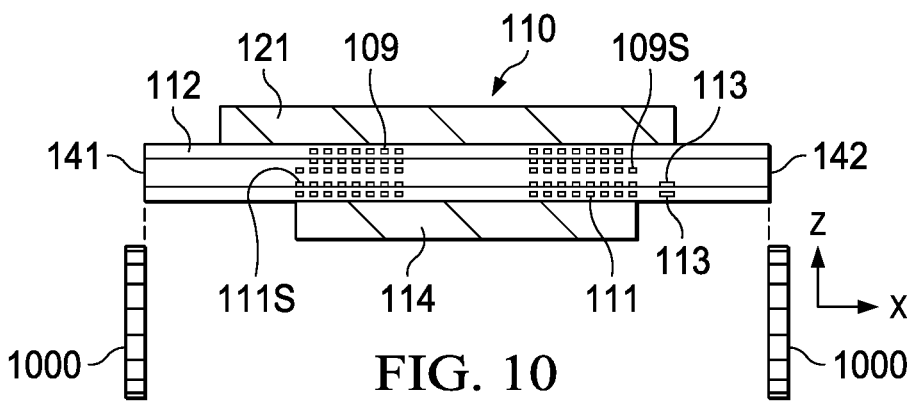

The method 700 further includes separating (e.g., singulating) the magnetic assembly at 706. In one example, the magnetic assembly process is used to concurrently fabricate multiple laminated magnetic assemblies, such as using a single large multilevel lamination structure 112, and attachment of one or more core structures 114, 121 to opposite sides thereof. FIG. 10 shows one example in which such a large lamination structure 112 is diced or cut to singulate or separate individual laminated magnetic assemblies 110 from the initial unitary structure. A singulation process 1000 is performed in the example of FIG. 10, which singulates or separates multiple laminated magnetic assemblies 110 from a starting unitary structure, for example, using a saw blade, etching, laser cutting, etc.

At 708, the magnetic assembly 110 is attached to the support structure 122. The attachment at 708 in one implementation includes attaching the magnetic assembly 110 to the support structure 122 with the first side 141 of the multilevel lamination structure 112 facing the first conductive leads 124-131, and with the second side 142 of the multilevel lamination structure 112 facing the second conductive leads 132-139. The attachment at 708 in this example also includes orienting the magnetic assembly 110 such that the conductive guard trace 113 (if included) is spaced apart from and between the first winding 111 of the multilevel lamination structure 112 and the second conductive leads 132-139.

Figure 11:
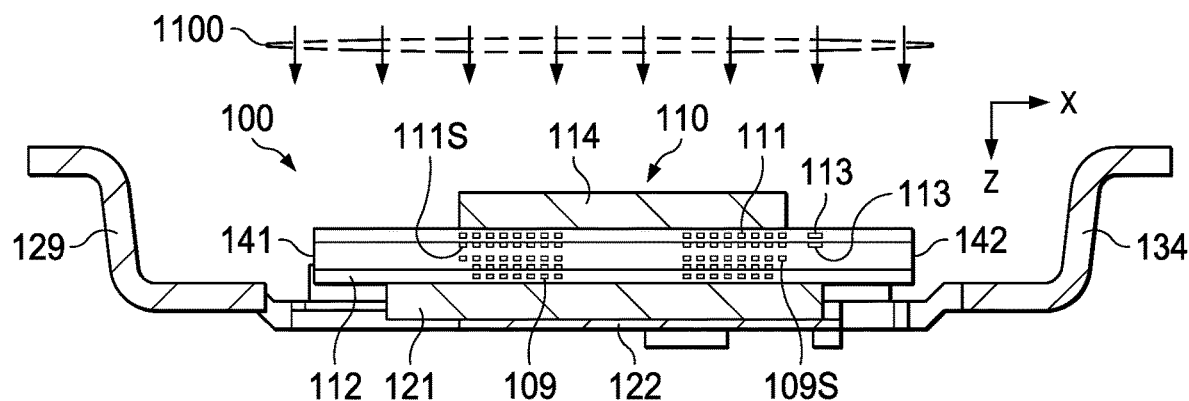

In one example, a lead frame structure is provided that includes conductive leads (e.g., 124-139 in FIGS. 1-6 above) and conductive die attach pads 104 and 108. In one implementation, the lead frame structure is provided on a tacky tape or other adhesive carrier, with the various constituent structures assembled in a predetermined relative arrangement to facilitate subsequent assembly steps in the method 700. FIG. 11 shows one example, in which an attachment process 1100 is performed that attaches the multilevel lamination structure 112 of the magnetic assembly 110 to a corresponding surface of the support structure 122. Any suitable attachment process 1100 can be used, such as application of adhesive, joining the components, and any necessary curing. In another example, conductive features of the multilevel lamination structure 112 can be soldered to the support structure 122 at 708.

Figure 12:
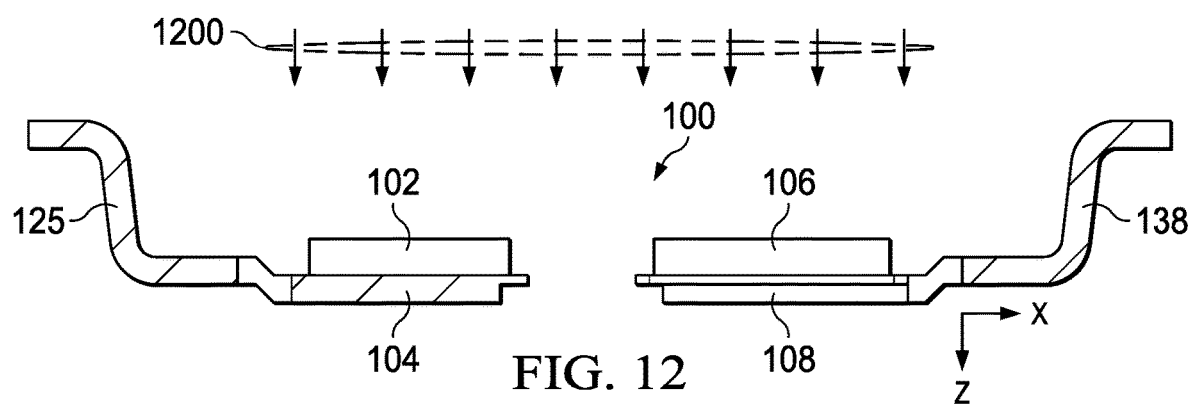

The process 700 continues at 710 and 712 in FIG. 7 with attaching semiconductor dies to corresponding die attach pads, for example, using adhesive or soldering. FIG. 12 shows one example in which a die attach process 1200 is performed that attaches the first semiconductor die 102 to the first die attach pad 104 (e.g., where the die attach pad 104 is one continuous conductive structure that includes the lead 125). At 712, the process 1200 also attaches the second semiconductor die 106 to the corresponding second die attach pad 108 (e.g., one continuous conductive structure that also includes the lead 138).

Figure 13:
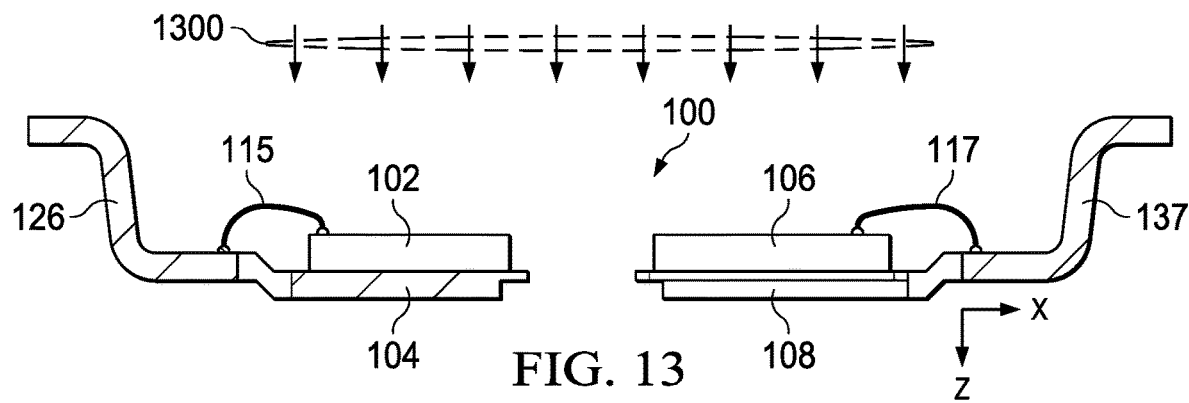

The method 700 also includes electrical connection processing (e.g., wire bonding) at 714. FIG. 13 shows one example in which a wire bonding process 1300 is performed that forms connections (e.g., bond wires 115-119 in FIGS. 1-6 above) between the semiconductor dies and one or more conductive leads and/or conductive features of the magnetic assembly 110 to form first and second circuits 161 and 162. In the illustrated sectional view of FIG. 13, the connection process 1300 includes forming the first bond wire connection 115 between a first conductive feature of the first semiconductor die 102 and the conductive lead 126, and forming a bond wire connection 117 between a first conductive feature of the second semiconductor die 106 and the conductive lead 137. In another example, different electrical connections are formed to create the first circuit 161, such as flip-chip processing to interconnect solder balls, conductive pillars, bond pads, etc. of the structures together in an electrical circuit. The electrical connection process 1300 couples the first semiconductor die 102, the first winding 111 of the multilevel lamination structure 112, the first conductive shield trace 111S of the multilevel lamination structure 112, and at least one of the set of first conductive leads 124-131 in the first circuit 161.

In addition, the electrical connection process 1300 couples the second semiconductor die 106, the second winding 109 of the multilevel lamination structure 112, the second conductive shield trace 109S, and at least one a set of second conductive leads 132-139 in a second circuit isolated from the first circuit. In one example, the electrical connection process 1300 couples the second conductive shield trace 109S to any included conductive guard trace 113. In one example, the electrical connection process 1300 couples the first conductive shield trace 111S to a ground reference node of the first circuit 161, and couples the second conductive shield trace 109S to a second ground reference node of the second circuit 162 (e.g., FIG. 23 below). Further connections can be made at 714 for a particular design, for example, to form the bond wires 115-119 shown in FIGS. 1-6.

In one example, the wire bonding process 1300 couples the first conductive shield trace 111S of the multilevel lamination structure 112 to the first circuit 161. In one implementation, the wire bonding process 1300 couples the second conductive shield trace 109S of the multilevel lamination structure 112 to the second circuit 162. In one example, moreover, the wire bonding process 1300 couples the conductive guard trace 113 to the second conductive shield trace 109S of the multilevel lamination structure 112. In another example, different electrical connections are formed to create the first circuit 161, such as flip-chip processing to interconnect solder balls, conductive pillars, bond pads, etc. of the structures together in a second electrical circuit. In certain examples, the wire bonding or other interconnection processing at 714 can be performed using supporting structures to provide mechanical structural support for one or more features of the magnetic assembly 110 during bond wire attachment. In one example, one or both magnetic core structures 114 and 121 can be supported with a custom bond wire clamping tool (not shown) during bond wire soldering operations. In one example, the bond wire clamping tool can include a cavity to support the laminate bond pad area that extends beyond the supported magnetic core structure.

The method 700 continues at 716 with forming the final package structure 120. In one example, the packaging at 716 includes performing a molding process (not shown) that forms the package structure 120 to enclose the dies 102 and 106, the conductive die attach pads 104 and 108, the support structure 122, the magnetic assembly 110, the electrical connections (e.g., the bond wires 115-119) and portions of the conductive leads 124-139. FIGS. 1-6 above show an example molded plastic package structure 120 formed at 716 in FIG. 7. In another example, a ceramic package structure can be formed at 716. At 718 in FIG. 7, further backend processing can be performed, such as lead forming and trimming, etc.

Figure 14:
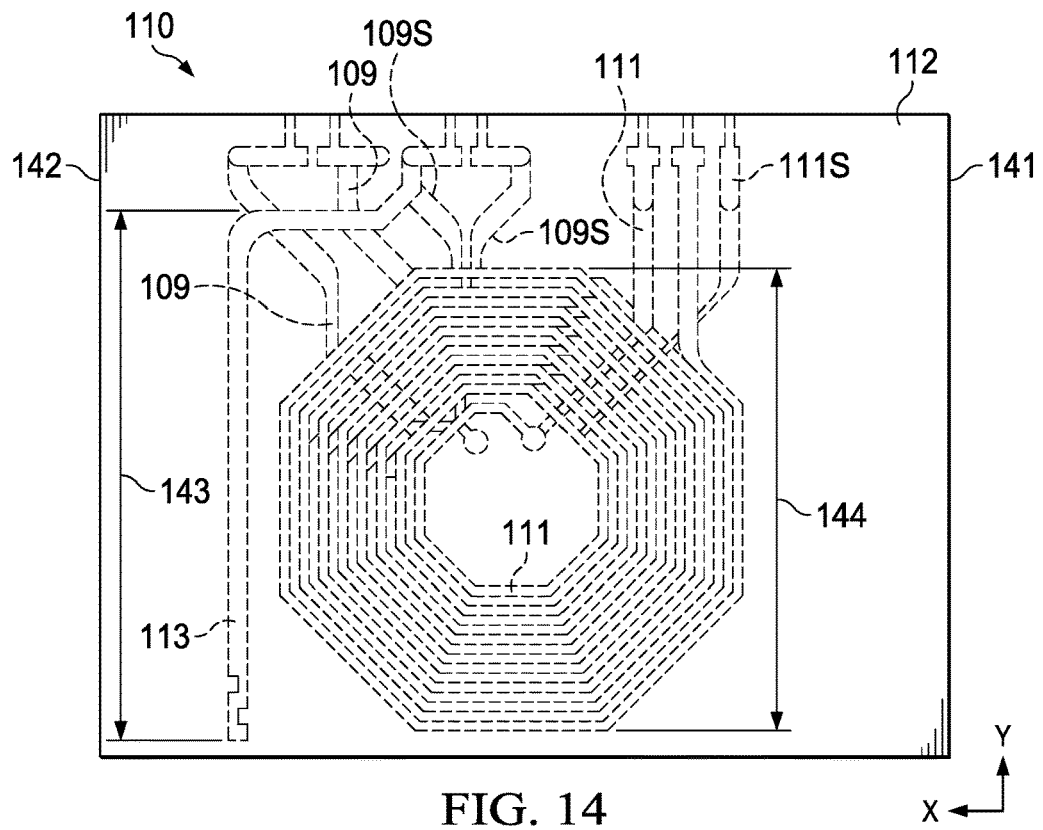
FIG. 14 is a bottom view of the multilevel lamination structure of the packaged electronic device of FIGS. 1-6 with first and second windings and first and second conductive shield traces.
Figure 15:
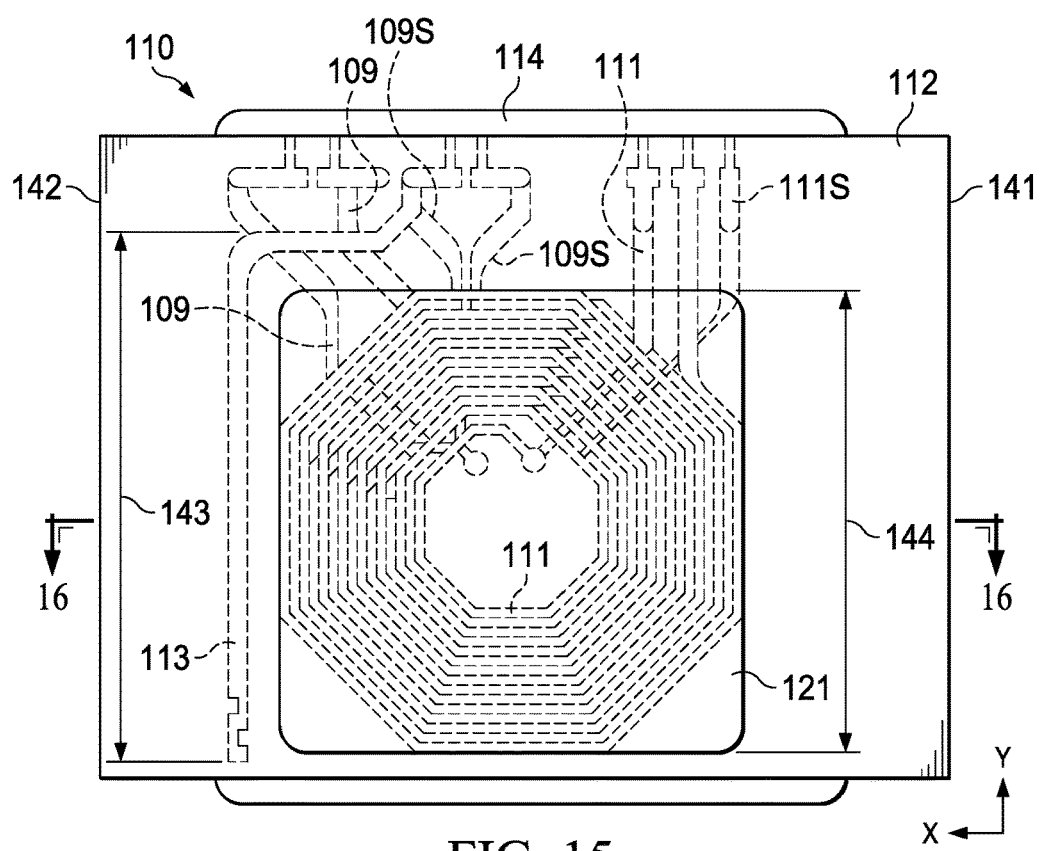
FIG. 15 is a bottom view of the magnetic assembly of the packaged electronic device of FIGS. 1-6 with the multilevel lamination structure of FIG. 14 and upper and lower cores.
Figure 16:
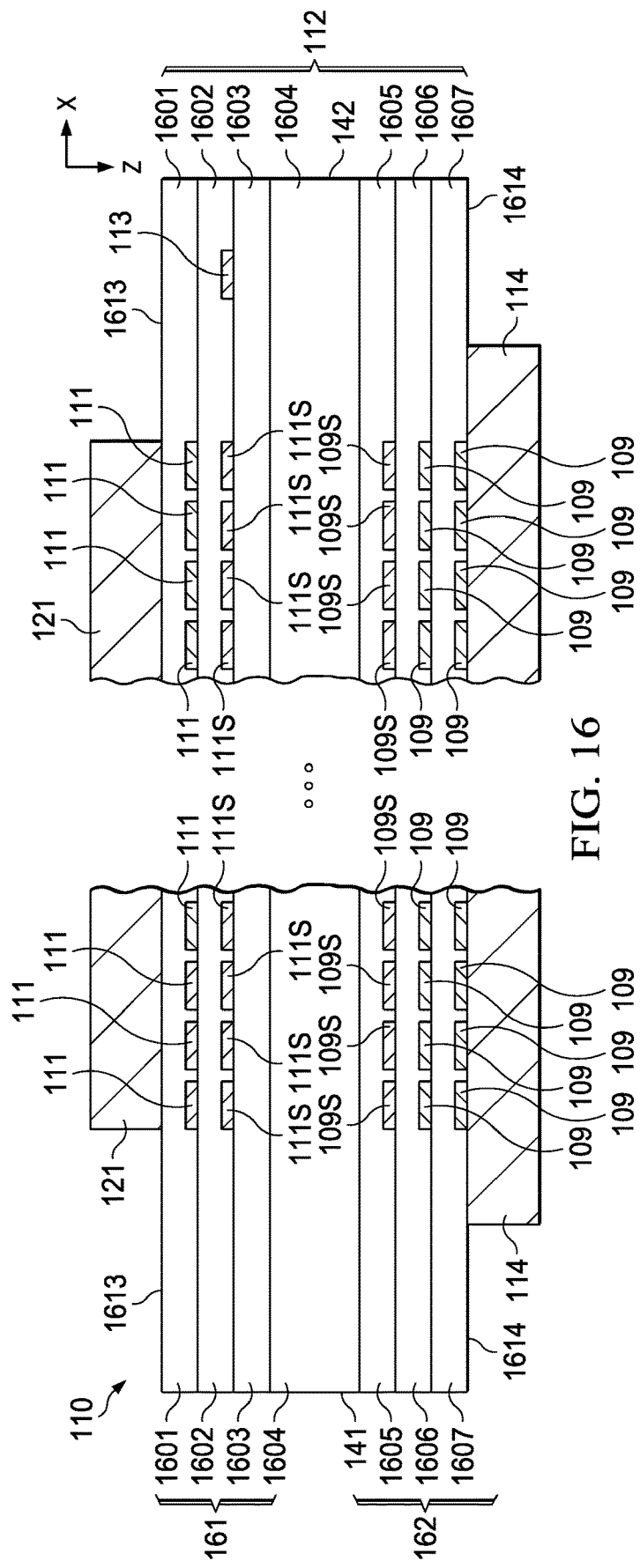
FIG. 16 is a partial sectional end view of one embodiment of the magnetic assembly taken along line 16-16 of FIG. 15.
Figure 17:
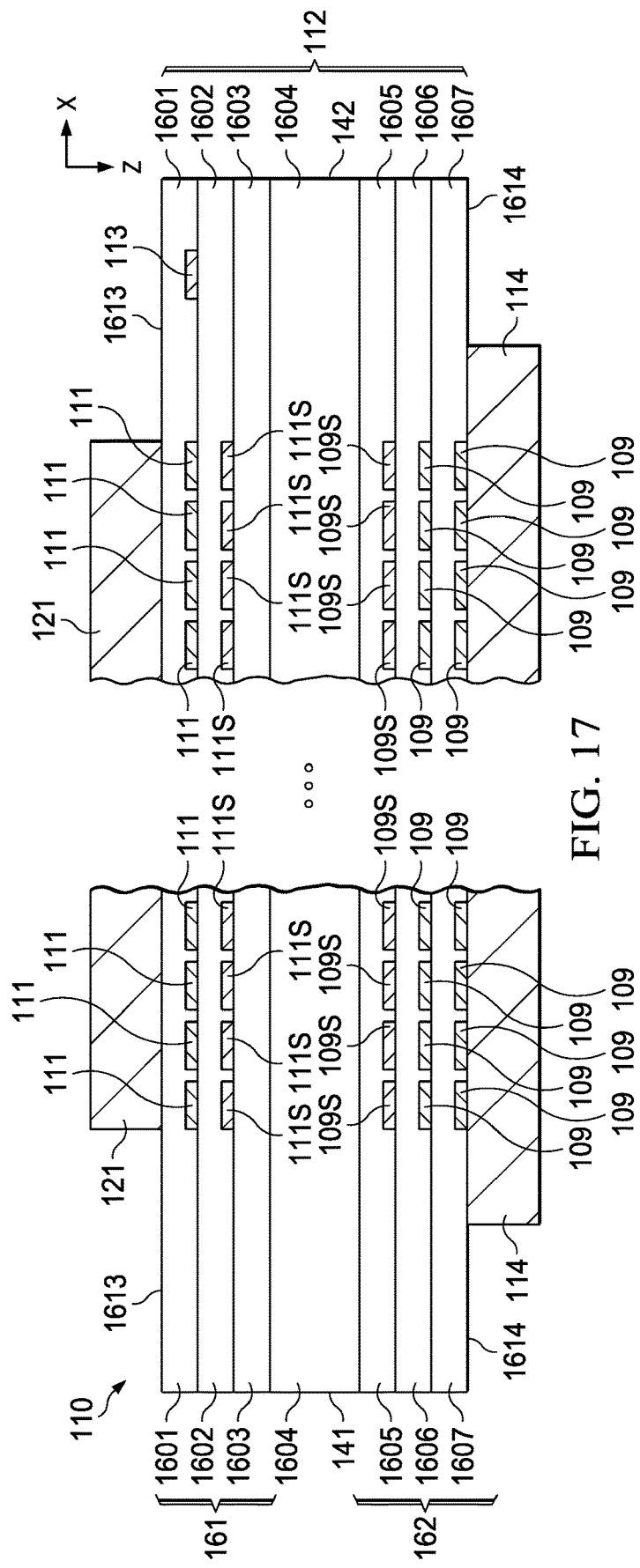
FIG. 17 is a partial sectional end view of another embodiment of the magnetic assembly taken along line 16-16 of FIG. 15.
Figure 18:
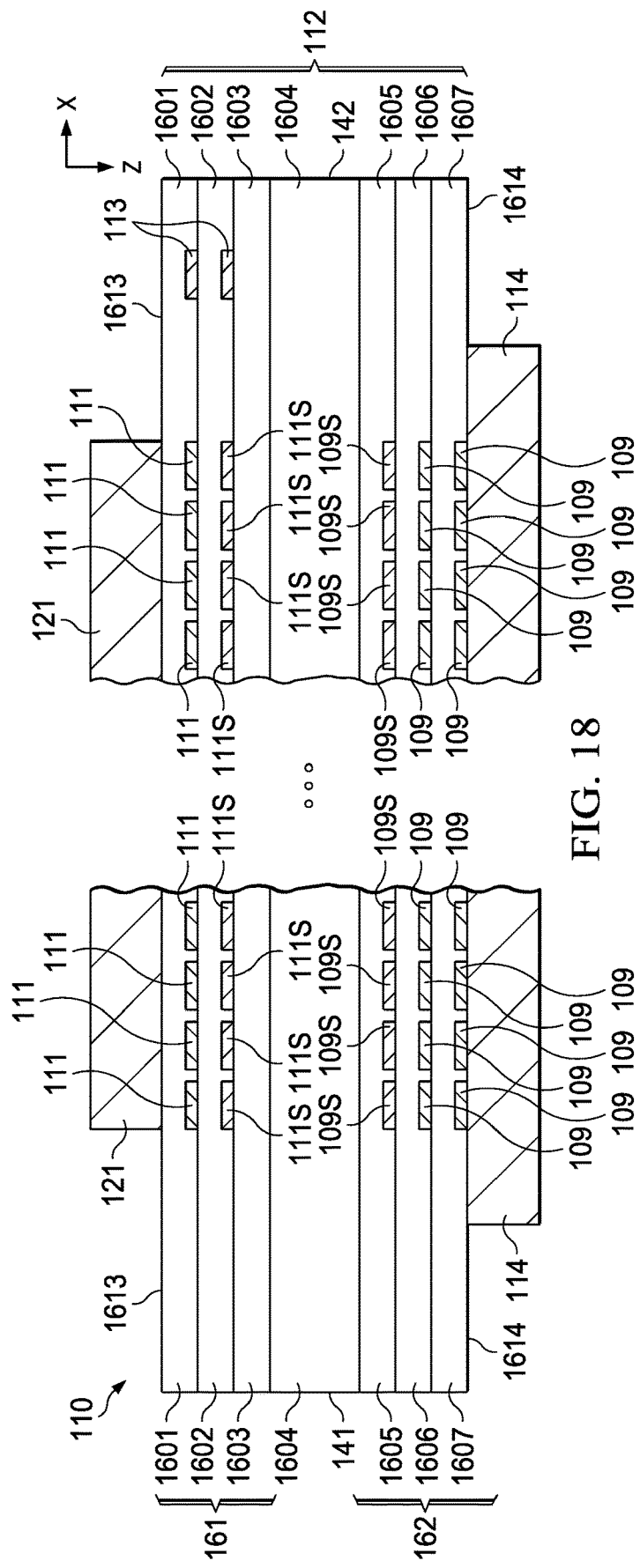
FIG. 18 is a partial sectional end view of a third embodiment of the magnetic assembly taken along line 16-16 of FIG. 15.

FIGS. 14-18 show further details of the example multilevel lamination structure 112. FIG. 14 shows a bottom view of the multilevel lamination structure 112 with first and second windings and a conductive guard trace, and FIG. 15 shows a bottom view of the magnetic assembly 110 with the multilevel lamination structure 112 and the respective upper and lower cores 114 and 121 attached. FIGS. 16-18 show partial sectional end views of three different embodiments of the magnetic assembly 110 taken along line 16-16 of FIG. 15. The multilevel lamination structure 112 is a multilayer structure with patterned conductive features 109, 109S, 111, 111S and 113 that form parts of a transformer. In one example, the first patterned conductive feature 111 forms a transformer primary winding, a second patterned conductive feature 109 forms a transformer secondary winding. In one example, further patterned conductive features form one or more second secondary windings, one or more conductive (e.g., Faraday) shields, one or more sense coils, along with one or more conductive shield traces, and the conductive guard trace 113.

The patterned conductive features in one example have components on multiple levels (e.g., layers) of the multilevel lamination structure 112, although not required of all possible implementations. In one example, the patterned winding turns of the individual primary and/or secondary windings extend on different layers of the multilevel lamination structure 112, although not required of all possible implementations. The example patterned winding features include multiple turns in a spiral pattern on the individual layers of the multilevel lamination structure 112, although other implementations are possible, such as single turn winding structures on a corresponding layer. The example patterned conductive features forming the transformer windings 109 and 111, shields 109S and 111S, and the guard trace 113 include conductive end connection features allowing interconnection of the windings to pins or semiconductor dies of the device 100, such as for bond wire connections 115-119 or other conductive interconnection types (e.g., solder balls, not shown) in the packaged electronic device 100. The semiconductor dies 102 and 106 include pillars, solder bumps, conductive landing pads or other conductive features (e.g., bond pads) that can be electrically interconnected to other structures using bond wires 115-119 or through direct soldering using any suitable electrical interconnection technology (e.g., wire bonding, flip-chip attachment, .etc.).

FIGS. 16-18 show outer portions of example implementations of the multilevel lamination structure 112, with inner or central portions omitted for clarity. As shown in FIGS. 16-18, the multilevel lamination structure 112 has the first side 141 and the opposite second side 142 spaced from one another along the X-direction, and a Z-direction stack of levels (e.g., layers) 1601-1607. The multilevel lamination structure 112 has a third side 1613 attached to the core 121 and a fourth side 1614 attached to the core 114 and spaced apart from the third side 1613 along the Z-direction. The first patterned conductive feature 111 includes multiple turns in a first level 1601 to form the first winding, and the second patterned conductive feature 109 has multiple turns in two different levels 1606 and 1607 to form the second winding. The second conductive shield 109S in this example is formed in a fifth level 1605, and the levels 1603 and 1604 form an isolation barrier between the primary and secondary circuits. In the example of FIG. 16, the conductive guard trace 113 and the first conductive shield 111S are formed in a second level 1602, where the conductive guard trace 113 is spaced apart from and between the first patterned conductive feature 111 and the second side 142 of the multilevel lamination structure 112. FIG. 17 shows another example, in which the conductive guard trace 113 is formed in the first level 1601, spaced apart from and between the first patterned conductive feature 111 and the second side 142 of the multilevel lamination structure 112. In the example of FIG. 18, the conductive guard trace 113 is formed in the respective first and second levels 1601 and 1602, and the conductive guard trace 113 is spaced apart from and between the first patterned conductive feature 111 and the second side 142 of the multilevel lamination structure 112.

The first conductive shield trace 111S in the examples of FIGS. 16-18 has multiple turns in the second level 1602 spaced apart from and between the first patterned conductive feature 111 and the second patterned conductive feature 109. In these examples, the second conductive shield trace 109S has multiple turns in another level 1605 between the first patterned conductive feature 111 and the second patterned conductive feature 109. In addition, the second conductive shield trace 109S is spaced apart from the conductive shield trace 111S. In alternate implementations, the guard trace 113 can be omitted from the examples of FIGS. 16-18. The embodiments of FIGS. 16-18 provide dual shield implementations with respective first and second shields 111S and 109S for the primary and secondary circuits 161 and 162.

Figure 19:
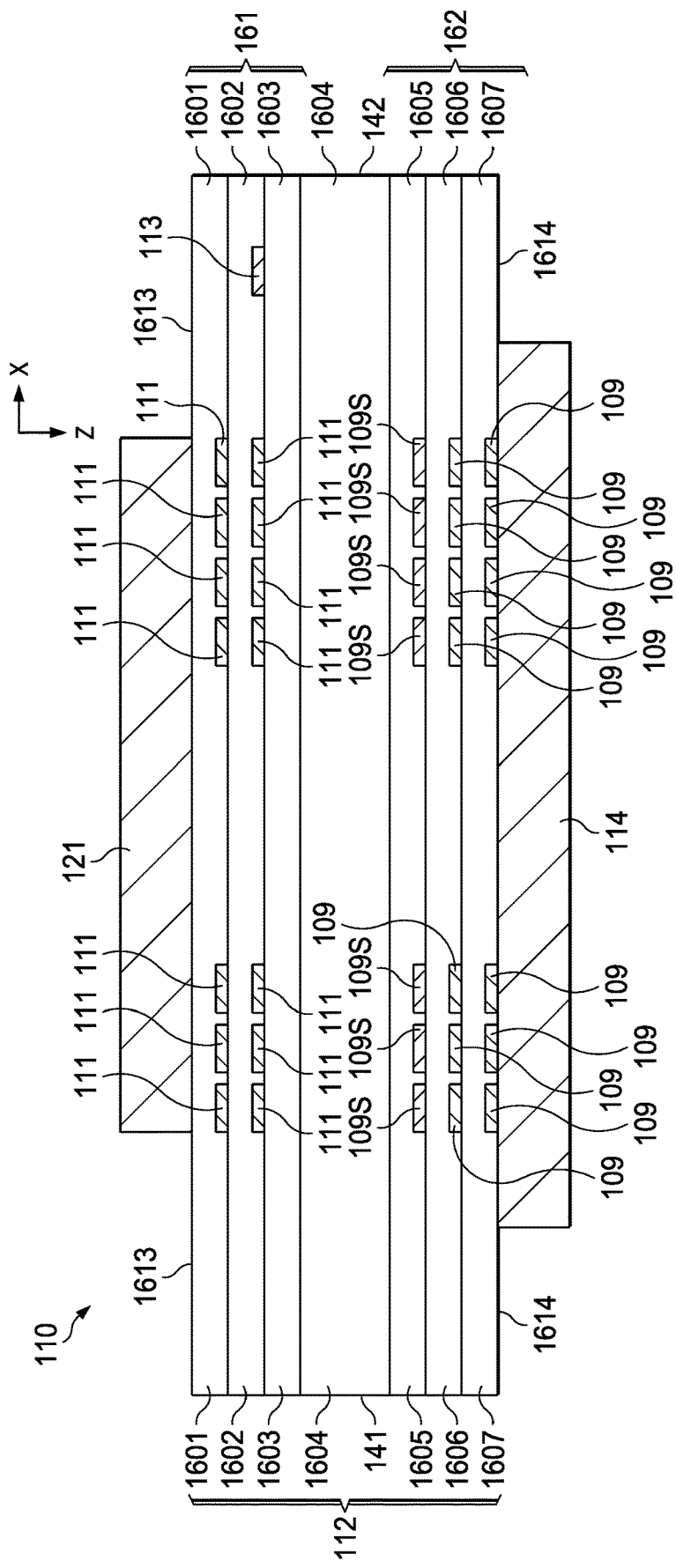
FIG. 19 is a partial sectional end view of a fourth embodiment of the magnetic assembly taken along line 16-16 of FIG. 15.

Referring also to FIGS. 19-22, several further shield trace examples are shown. FIG. 19 shows a partial sectional end view of a fourth embodiment of the magnetic assembly 110 taken along line 16-16 of FIG. 15. This example is a single shield with the second conductive shield trace 109S coupled in the second (e.g., secondary) circuit 162 in the fifth level 1605 spaced apart from and between the turns of the respective first and second conductive traces 109 and 111 along the Z direction. In this example, the secondary coil traces 109 extend in the respective sixth and seventh levels 1606 and 1607. The second conductive shield trace 109S has turns in the fifth level 1605 that are spaced apart from and generally coextensive with the secondary coil traces 109.

Figure 20:
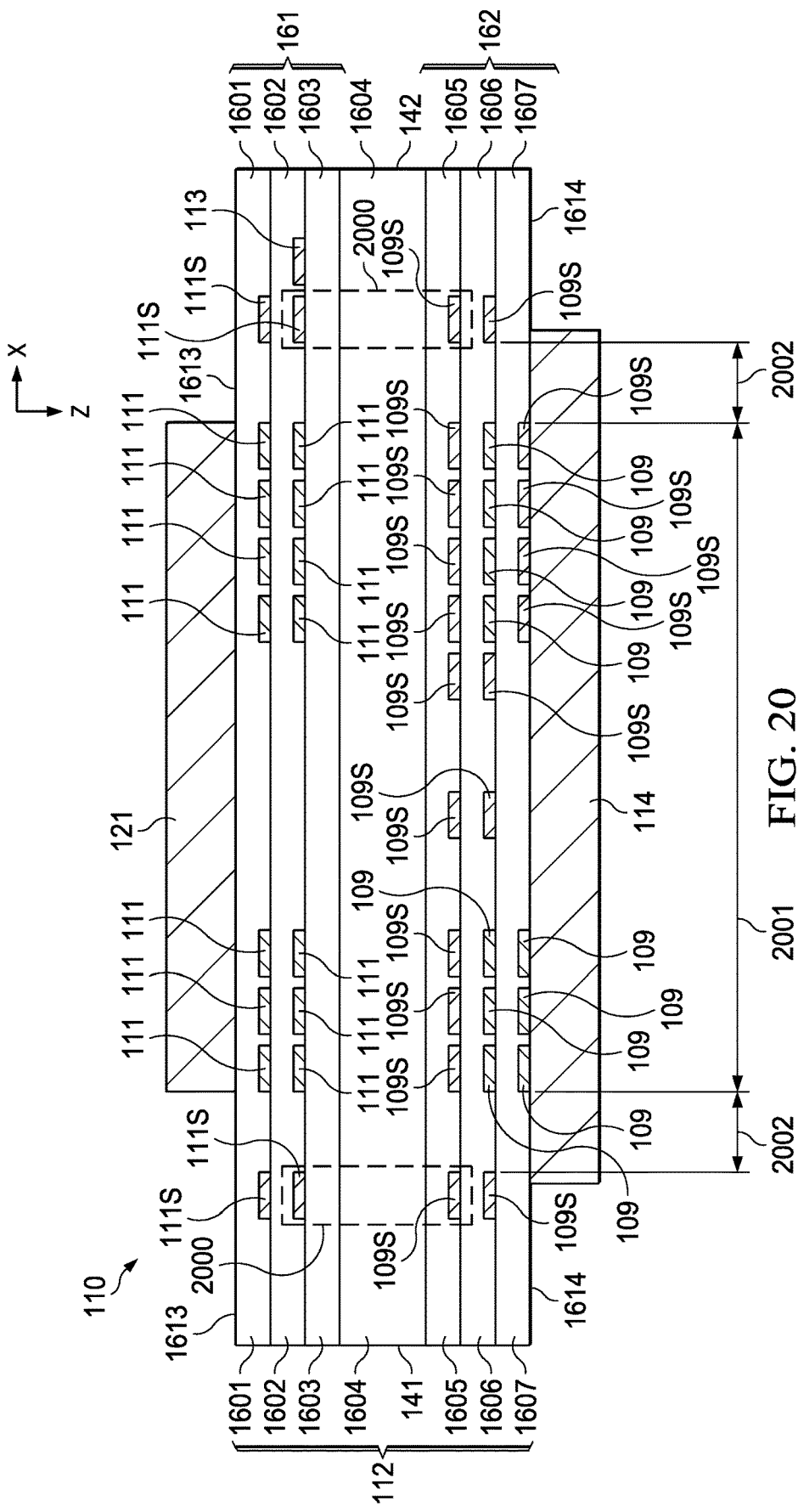
FIG. 20 is a partial sectional end view of a fifth embodiment of the magnetic assembly taken along line 16-16 of FIG. 15.
Figure 25:
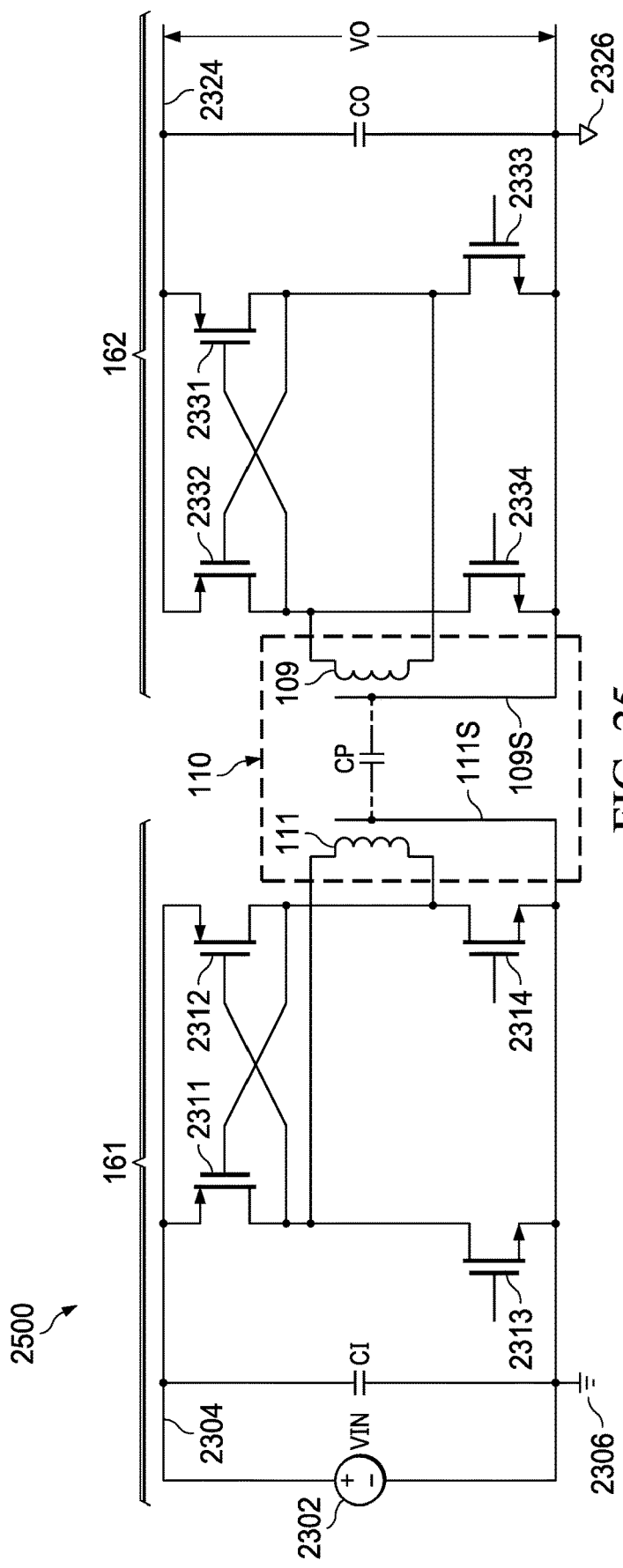
FIG. 25 is a schematic diagram of another embodiment of the packaged electronic device of FIGS. 1-6 with first and second conductive shield traces coupled to the respective first and second ground reference nodes of the first and second circuits.

FIG. 20 shows a dual shield example of the magnetic assembly 110 taken along line 16-16 of FIG. 15. This example provides dual peripheral shield traces 109S and 111S along with peripheral shield traces in the respective levels of the respective first and second conductive traces 109 and 111. This example further includes the guard trace 113 in the second level 1602, which can be omitted in another implementation. In the example of FIG. 20, the conductive shield trace 111S includes a turn laterally spaced outward along the X direction from the outermost lateral extent of the first patterned conductive feature 111 in the first level 1601. As shown in FIG. 20, the first and second conductive traces 109 and 111 occupy a central portion of the magnetic assembly 110 along a lateral width dimension 2001, and the peripheral turns of the conductive shield traces 109S and 111S are spaced by a non-zero distance 2002 from the outermost lateral extent of the patterned conductive features 111 and 109. The second conductive shield trace 109S in this example includes a turn laterally spaced outward from the outermost turn of the second patterned conductive feature 109 in the levels 1605 and 1606. In this implementation, the peripheral turns of the conductive shield traces 109S and 111S face each other across a dielectric of the levels 1603, 1604 and 1605, and form one or more parasitic capacitors 2000 as shown in FIG. 20. As schematically shown in FIG. 25 below, the parasitic capacitor or capacitors 2000 (CP) facilitate EMI reduction by providing a capacitive impedance between the isolated first and second circuits 161 and 162. Moreover, the example of FIG. 20 provides interleaved shield traces, in which the second conductive shield trace 109S in the sixth level 1606 is interleaved with a turn of the second patterned conductive feature 109.

Figure 21:
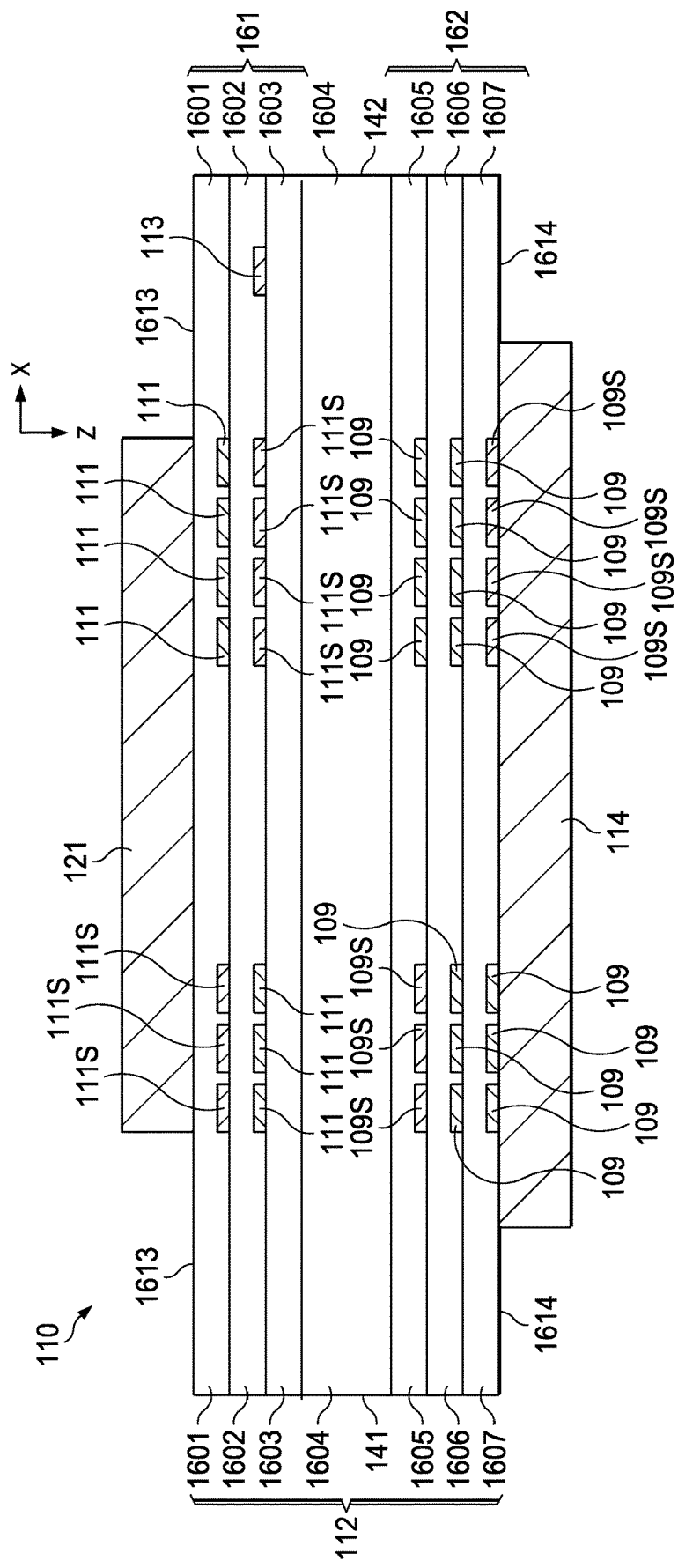
FIG. 21 is a partial sectional end view of a sixth embodiment of the magnetic assembly taken along line 16-16 of FIG. 15.
Figure 22:
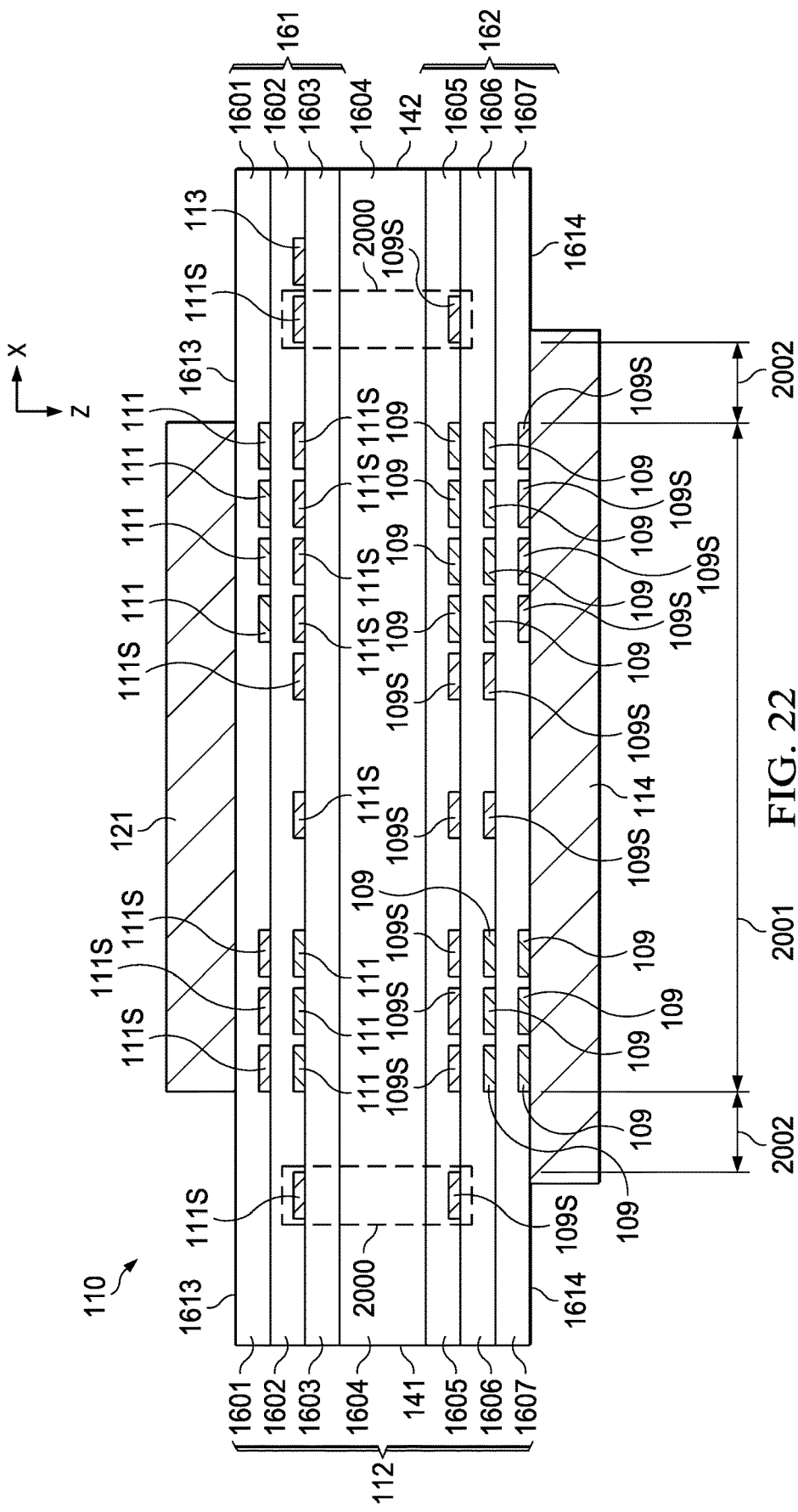
FIG. 22 is a partial sectional end view of a seventh embodiment of the magnetic assembly taken along line 16-16 of FIG. 15.

FIG. 21 shows a sixth embodiment of the magnetic assembly 110 taken along line 16-16 of FIG. 15. This example also provides an interleaved shield trace configuration, in which turns of both the second patterned conductive feature 109 and the second conductive shield trace 109S are formed in the fifth and seventh levels 1605 and 1607. The example magnetic assembly 110 of FIG. 22 provides interleaved peripheral shields, and which the first and second levels 1601 and 1602 both include turns of the first patterned conductive feature 111 as well as the first conductive shield trace 111S. In addition, the lamination structure levels 1605, 1606 and 1607 each include turns of both the second patterned conductive feature 109 and the second conductive shield trace 109S. In addition, like the example of FIG. 20 above, the conductive shield traces 111S and 109S each include a turn laterally spaced outward from the outermost turn of the respective patterned conductive features 111 and 109 in the second and fifth levels 1602 and 1605 to provide one or more corresponding parasitic capacitors 2000.

Figure 23:
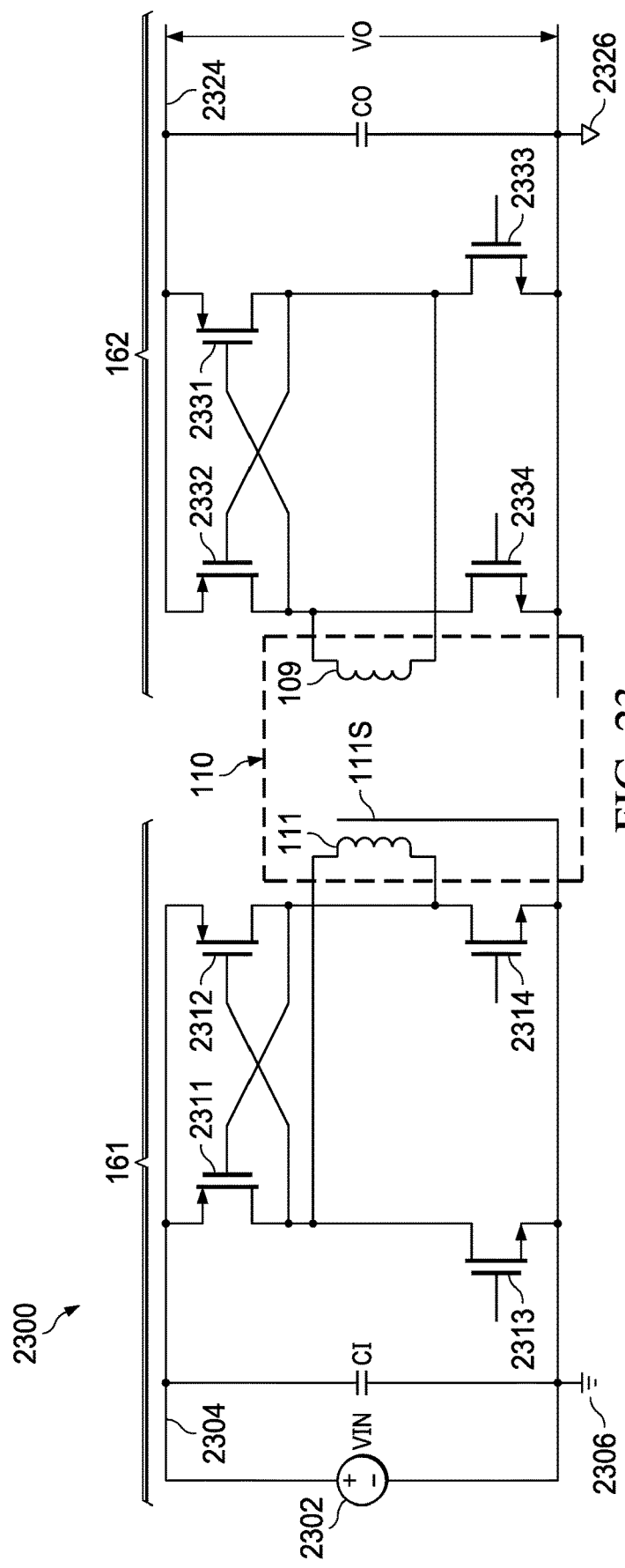
FIG. 23 is a schematic diagram of an embodiment of the packaged electronic device of FIGS. 1-6 with a first conductive shield trace coupled to a first ground reference node of the first circuit.
Figure 24:
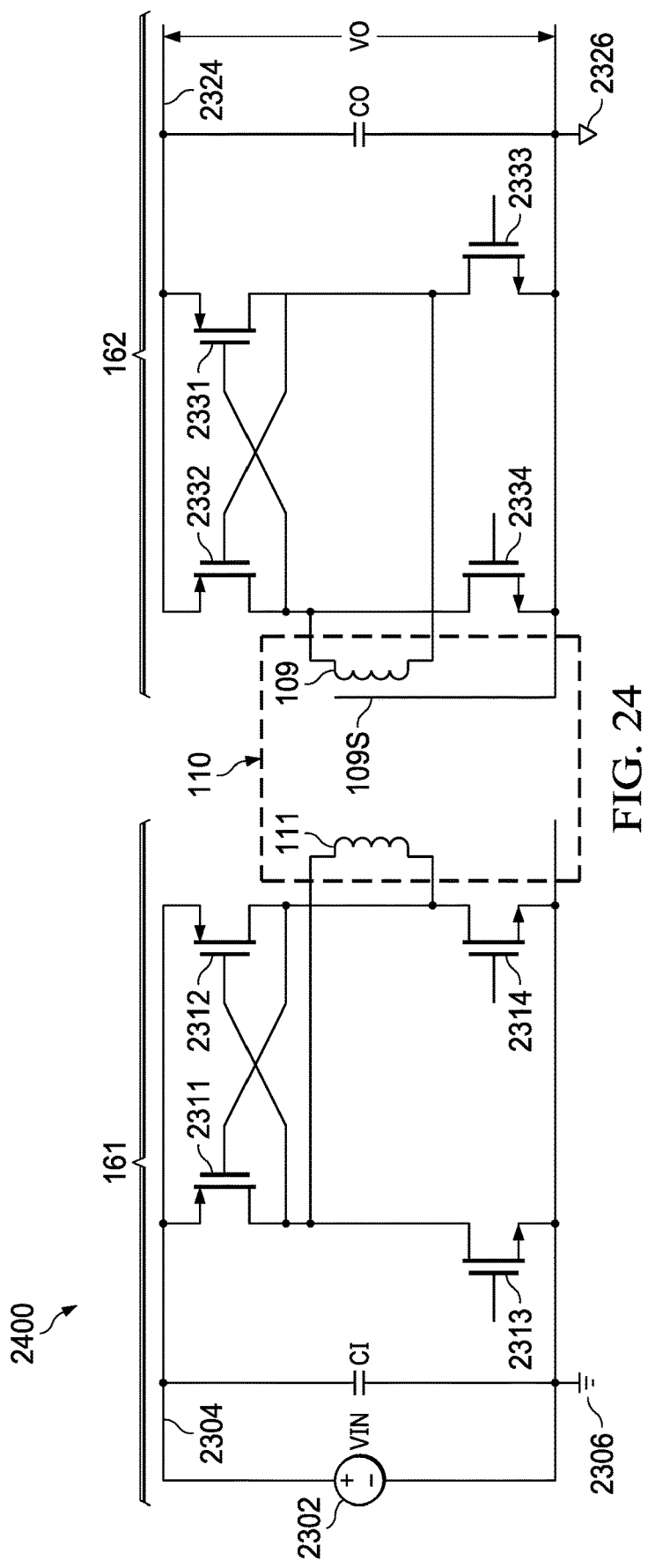
FIG. 24 is a schematic diagram of another embodiment of the packaged electronic device of FIGS. 1-6 with a second conductive shield trace coupled to a second ground reference node of the second circuit.

FIGS. 23-25 illustrate three example electrical interconnections of the first and second circuits 161 and 162. FIG. 23 provides a schematic diagram 2300 showing one example with a first conductive shield trace 111S coupled to a first ground reference node of the first circuit 161. As schematically shown in FIG. 23, the first conductive shield trace 111S extends between the first and second conductive features 111 and 109 that form the primary and secondary windings of the transformer. The schematic diagram 2300 of FIG. 23 also shows example circuit components of the first and second circuits 161 and 162. In this implementation, an input voltage source 2302 provides an input voltage VIN to an input node 2304 referenced to a ground reference node 2306 of the first circuit 161. An input capacitor CI is coupled between the input node 2304 and the first ground reference node 2306. A cross-coupled pair of PMOS transistors 2311 and 2312 have sources coupled to the input node 2304, and drains coupled to opposite ends of the primary winding 111 (the ends of the first patterned conductive feature 111). Switched NMOS transistors 2313 and 2314 are respectively coupled between the drains of the respective transistors 2311 and 2312, and the first ground reference node 2306. The secondary circuit 162 provides an output voltage VO at an output terminal 2324 reference to a second ground reference node 2326 of the second circuit 162. An output capacitor CO is coupled across the terminals 2324 and 2326. The second circuit 162 also includes a cross-coupled pair of PMOS transistors 2331 and 2332 individually coupled between the output node 2324 and a respective and of the secondary winding 109 (the second patterned conductive feature 109). NMOS transistors 2333 and 2334 are individually coupled between the drains of the respective PMOS transistors 2331 and 2332, and the second ground reference node 2326.

FIG. 24 shows a schematic diagram 2400 of another embodiment of the packaged electronic device of FIGS. 1-6 with a second conductive shield trace 109S coupled to the second ground reference node 2326 of the second circuit 162. FIGS. 23 and 24 provide single shield interconnections of the first and second circuits 161 and 162, with a ground referenced shield between the primary and secondary windings 111 and 109 for EMI control or reduction. In one simulated example, the provision of the single sided faraday shield in FIG. 23 or 24 provides an EMI reduction of 3-5 dB.

FIG. 25 shows a schematic diagram 2500 of a dual shield embodiment of the packaged electronic device of FIGS. 1-6 with first and second conductive shield traces 1115 and 109S position between the primary and secondary windings 111 and 109. In addition, the dual shield traces 111S and 109S in FIG. 25 provide a parasitic capacitor CP (e.g., capacitors 2000 in FIGS. and 22 above) coupled to the respective first and second ground reference nodes 2306 and 2326 of the first and second circuits 161 and 162. In this implementation, the first conductive shield trace 1115 is coupled to the ground reference node 2306 of the first circuit 161, and the second conductive shield trace 109S is coupled to the second ground reference node 2326 of the second circuit 162. In one simulated example, the dual faraday shield in FIG. 25 provides an EMI emissions reduction of approximately 10-12 dB.

The described examples provide integrated magnetics for packaged electronic devices with integral EMI reduction features with no increase in cost and no external circuits or components for isolated DC to DC converters or other applications. In addition, the EMI reduction is independent of design expertise for end-use customers, as no additional board level circuit components are needed. In various implementations, conductive shield traces are patterned on one or more levels of the multilevel lamination structure 112, and these can be connected to the associated first or second circuit, such as to ground reference nodes thereof, during wire bonding or other electrical interconnection processing in fabrication. Various implementations provide single layer shields between transformer coils, dual shields positioned between or peripherally to the transformer coils, for example, to create one or more parasitic capacitors, as well as interleaved shields. In operation, the interleaved shield examples provide an interim option between the best EMI reduction performance of the dual shield configurations and the single shield examples that provide high coupling. Shield coils in certain examples can be positioned around a power coil. In other implementations, the conductive shield traces provide block capacitor shields. The block capacitor shields form plates of a capacitor in different levels, that are separated by one or more dielectric layers, where the respective capacitor plates are connected to respective ones of the first and second circuits, and where the capacitor plate structures may, but need not, form a turn around the power coil, in order to address near field emissions by adding capacitance (e.g., capacitors 2000 in FIGS. 20 and 22 above). The described examples also provide package level solutions to address electromagnetic interference and can be used alone or in combination with external circuit components and/or silicon-based solutions like SSM. The described examples, moreover, provide integrated EMI solutions independent of silicon process node and/or system-level board designs.

Modifications are possible in the described embodiments, and other embodiments are possible, within the scope of the claims.

The following is claimed:

1. A method for fabricating an electronic device, the method comprising:
attaching a magnetic assembly with a multilevel lamination structure to a support structure;

attaching a first semiconductor die to a first die attach pad;

attaching a second semiconductor die to a second die attach pad;

performing an electrical connection process that: couples the first semiconductor die, a first winding of the multilevel lamination structure, a first conductive shield trace of the multilevel lamination structure, and at least one of a set of first conductive leads in a first circuit; and couples the second semiconductor die, a second winding of the multilevel lamination structure, a second conductive shield trace of the multilevel lamination structure, and at least one a set of second conductive leads in a second circuit isolated from the first circuit; and performing a molding process that encloses the magnetic assembly, the die attach pads, the semiconductor dies, portions of the first and second conductive leads in a package structure.

2. The method of claim 1, wherein the electrical connection process couples the first conductive shield trace to a ground reference node of the first circuit, and couples the second conductive shield trace to a second ground reference node of the second circuit.

3. A method for fabricating an electronic device, comprising:

exposing first conductive leads to an exterior of a package structure;

exposing second conductive leads to the exterior of the package structure;

placing a multilevel lamination structure in the package structure, the multilevel lamination structure including:
- a first patterned conductive feature having multiple turns in a first level to form a first winding coupled to at least one of the first conductive leads in a first circuit;
- a second patterned conductive feature having multiple turns in a different level to form a second winding coupled to at least one of the second conductive leads in a second circuit isolated from the first circuit; and
- a conductive shield trace having multiple turns in a second level spaced apart from and between the first patterned conductive feature and the second patterned conductive feature, the conductive shield trace coupled in the first circuit.

4. The method of claim 3, further comprising:

attaching a first semiconductor die to a first die attach pad at least partially in the package structure;

attaching a second semiconductor die to a second die attach pad at least partially in the package structure;

forming a first set of electrical connections that couple the first semiconductor die, the first patterned conductive feature, the conductive shield trace, and the at least one of the first conductive leads in the first circuit; and forming a second set of electrical connections that couple the second semiconductor die, the second patterned conductive feature, and the at least one of the second conductive leads in the second circuit.

5. The method of claim 4, wherein the multilevel lamination structure includes a second conductive shield trace having multiple turns in another level between the first patterned conductive feature and the second patterned conductive feature, the second conductive shield trace being coupled in the second circuit, and the second conductive shield trace being spaced apart from the conductive shield trace.

6. The method of claim 5, wherein:
the conductive shield trace is coupled to a ground reference node of the first circuit; and
the second conductive shield trace is coupled to a second ground reference node of the second circuit.

7. The method of claim 5, wherein:
the conductive shield trace includes a turn laterally spaced outward from an outermost lateral extent of the first patterned conductive feature in the first level; and
the second conductive shield trace includes a turn laterally spaced outward from an outermost turn of the second patterned conductive feature in the different level.

8. The method of claim 7, wherein:
the conductive shield trace is interleaved with a turn of the first patterned conductive feature in the first level; and
the second conductive shield trace is interleaved with a turn of the second patterned conductive feature in the different level.

9. The method of claim 5, wherein:
the conductive shield trace is interleaved with a turn of the first patterned conductive feature in the first level; and
the second conductive shield trace is interleaved with a turn of the second patterned conductive feature in the different level.

10. The method of claim 3, wherein the conductive shield trace includes a turn laterally spaced outward from an outermost lateral extent of the first patterned conductive feature in the first level.

11. The method of claim 3, wherein the conductive shield trace is interleaved with a turn of the first patterned conductive feature in the first level.

12. The method of claim 3, wherein:
the first conductive leads are positioned along a first side of a package structure; and
the second conductive leads are positioned along a different second side of the package structure.

13. The method of claim 3, further including attaching a core structure to a side of the lamination structure adjacent the first level.

14. The method of claim 13, further including attaching a second core structure to a different second side of the lamination structure adjacent the different level.

15. The method of claim 3, further including a positioning a conductive guard trace, spaced apart from the first patterned conductive feature, between an outermost turn of the first conductive feature and a side of the multilevel lamination structure.

16. The method of claim 3, further including placing a second conductive shield trace with multiple turns in another level between the first patterned conductive feature and the second patterned conductive feature.

17. The method of claim 3, further including placing a second conductive shield trace with multiple turns in another level between the first patterned conductive feature and the second patterned conductive feature.

18. The method of claim 5, wherein the second conductive shield trace is coupled to the conductive guard trace.

19. The method of claim 3, further including adding one or more structures for facilitating forming a magnetic circuit in combination with the first patterned conductive feature.

20. The method of claim 3, further including attaching a core structure to a first side of the multilevel lamination structure.

21. The method of claim 3, further including attaching a core structure to a second side of the multilevel lamination structure.

22. The method of claim 3, further including attaching a first core structure to a first side of the multilevel lamination structure and attaching a second core structure to a second side of the multilevel lamination structure.

23. The method of claim 22, wherein the first core structure and the second core structure are the same size.

24. The method of claim 22, wherein the first core structure and the second core structure are different sizes.

25. The method of claim 22, wherein the first core structure, the second core structure and the multilevel lamination structure comprise a magnetic assembly.

26. The method of claim 4, further including attaching a first core structure to a first side of the multilevel lamination structure and attaching a second core structure to a second side of the multilevel lamination structure.

27. The method of claim 14, wherein the first core structure and the second core structure are one of the same size and difference sizes.

28. The method of claim 14, wherein the first core structure and the second core structure are different sizes.

29. The packaged electronic device of claim 14, wherein the first core structure, the second core structure and the multilevel lamination structure comprise a magnetic assembly.

* * * * *